(12) United States Patent
Uhland et al.

(10) Patent No.: US 7,727,806 B2
(45) Date of Patent: Jun. 1, 2010

(54) SYSTEMS AND METHODS FOR HIGH DENSITY MULTI-COMPONENT MODULES

(75) Inventors: Scott A. Uhland, Redwood City, CA (US); Seth M. Davis, Lexington, MA (US); Stanley R. Shanfield, Newton, MA (US); Douglas W. White, Lexington, MA (US); Livia M. Racz, Belmont, MA (US)

(73) Assignee: Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 11/799,333

(22) Filed: May 1, 2007

(65) Prior Publication Data

US 2007/0254411 A1 Nov. 1, 2007

Related U.S. Application Data

(60) Provisional application No. 60/796,488, filed on May 1, 2006.

(51) Int. Cl.
*H01L 21/00* (2006.01)

(52) U.S. Cl. ............................. 438/109; 257/E21.511

(58) Field of Classification Search ................. 438/107, 438/108, 109; 257/E21.511, E21.614
See application file for complete search history.

(56) References Cited

U.S. PATENT DOCUMENTS

| | | | |
|---|---|---|---|
| 5,108,825 | A | 4/1992 | Wojnarowski et al. |
| 5,111,278 | A | 5/1992 | Eichelberger |
| 5,162,260 | A | 11/1992 | Leibovitz et al. |
| 5,250,843 | A | 10/1993 | Eichelberger |
| 5,298,288 | A | 3/1994 | Curry, II et al. |
| 5,841,193 | A | 11/1998 | Eichelberger |
| 5,866,952 | A | 2/1999 | Wojnarowski et al. |
| 6,117,704 | A | 9/2000 | Yamaguchi et al. |
| 6,203,967 | B1 | 3/2001 | Westbrook et al. |
| 6,424,545 | B2 | 7/2002 | Burton |
| 6,440,641 | B1 | 8/2002 | Lykins et al. |
| 6,544,638 | B2 | 4/2003 | Fischer et al. |
| 6,882,034 | B2 | 4/2005 | Corisis et al. |
| 2004/0070083 | A1 | 4/2004 | Su |
| 2004/0145051 | A1* | 7/2004 | Klein et al. .................. 257/734 |
| 2004/0174223 | A1 | 9/2004 | Achyut |
| 2005/0112798 | A1 | 5/2005 | Bjorbell |

OTHER PUBLICATIONS

Ziptronix, Inc. whitepaper. 3D Integration for Mixed Signal Applications. (2002).

Takahashi et al. Development of Advanced 3D Chip Stacking Technology with Ultra-Fine Interconnection. IEEE 2001 Electronic Components and Technology Conference.

(Continued)

*Primary Examiner*—W. David Coleman
(74) *Attorney, Agent, or Firm*—Goodwin Procter LLP

(57) ABSTRACT

A method for forming a device, comprising providing a first substrate carrying a first set of components disposed in a first encapsulating layer over the first set of components, providing a second substrate carrying a second set of components disposed in a second encapsulating layer over the second set of components, bonding the first and second substrates and functionally interconnecting at least one of the predefined components in the first set of components with at least one of the components in the second set of components.

39 Claims, 18 Drawing Sheets

OTHER PUBLICATIONS

Koyanagi, et al., "Neuromorphic Vision Chip Fabricated Using Three-Dimensional Integration Technology," 2001 IEEE International Solid-State Circuits Conference (2001).

Singer et al. Cost Considerations for CSP Variations. Presented at Chip Scale International, May 1998.

Kohl et al., Low cost chip scale packaging and interconnect technology. Proceedings of the Surface Mount International Conference (1997).

3D System Integration. Whitepaper of the Fraunhofer Institut, (2003).

Gann, Keith D. Neo-Stacking Technology. HDI Magazine (Dec. 1999).

Warner, et al. Layer Transfer of FDSOI CMOS to 150mm InP Substrates for Mixed-Material Integration. (2006).

Suntharalingarn, et al. Megapixel CMOS Image Sensor Fabricated in Three-Dimensional Integrated Circuit Technology. 2005 IEEE International Solid-State Circuits Conference (2005).

Aull, et al. Laser Radar Imager Based on 3D Integration of Geiger-Mode Avalanche Photodiodes with Two SOI Timing Circuit Layers. 2006 IEEE International Solid-State Circuits Conference (2006).

Warner, et al. An Investigation of Wafer-to-Wafer Alignment Tolerances for Three-Dimensional Integrated Circuit Fabrication. (2004).

Burns, et al. A Wafer-Scale 3-D Circuit Integration Technology. IEEE Transaction on Electron Devices. 53:10, 2507-16 (Oct. 2006).

Yarema, Ray. Fermilab Initiatives in 3D Integrated Circuits and SOI Design for HEP. ILC Vertex Workshop. (May 2006).

Huffman, Alan. 50 Micron Pitch Flip Chip Bumping Technology: Processes and Applications. IEEE Components, Packaging & Manufacturing Technology Society. (2006).

Souriau, Jean-Charles. Wafer Level Processing of 3D System-in-Package for RF and Data Applications. 2005 IEEE Electronic Components and Technology Conference (2005).

Ziptronix, Inc. Benefits of 3D Integration in Digital Imaging Applications. Ziptronix whitepaper (2002).

Amkor Technology data sheet. Wafer Level Packaging CSP (2005).

Fusaro, Jim. Packaging Solutions for Mobile Applications. Amkor Technology presentation to JEDEC/CES (2007).

Quddus, M. JEDEC and Memory Standardization, (2007).

Cooke, Jim. Low power Mobile DRAM and PSRAM for Mobile Applications. JEDEC Presentation to CES 2007.

Garrou, P. Wafer-Level 3-D Integration Moving Forward. *Semiconductor International* (Oct. 1, 2006).

Garrou, P. Integrated Passives . . . Are We There Yet? *Semiconductor International* (Oct. 1, 2005).

Vitkavage, S. Making the Business Case for 3D. *Future Fab International*, vol. 22. (Jan. 9, 2007).

Singer, Peter. 3-D Die Interconnect Forecast. *Semiconductor International* (Nov. 1, 2006).

Peters, Laura. Deep Silicon Etching Gets Ready for 3-D ICs. *Semiconductor International* (Sep. 1, 2006).

Töpper et al. The Wafer-Level Packaging Evolution. *Semiconductor International* (Oct. 1, 2004).

Keser, B. Redistributed Chip Packaging. Semiconductor Packaging, (2005).

Pogge, H. Bernhard. Realizing Effective SOCs: From planar 2D to viable 3D ICs, (2004).

LoPiccolo, P. Mapping progress in 3D IC integration. Solid State Technology (2007).

\* cited by examiner

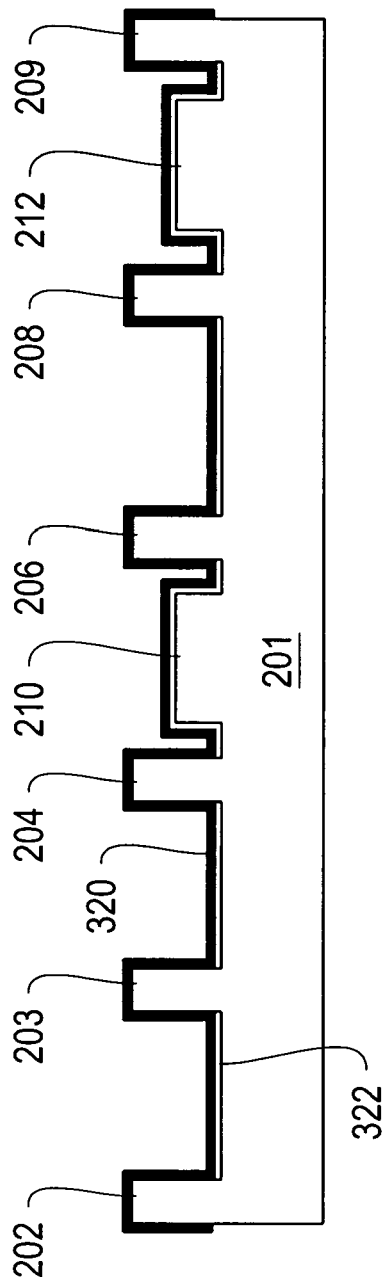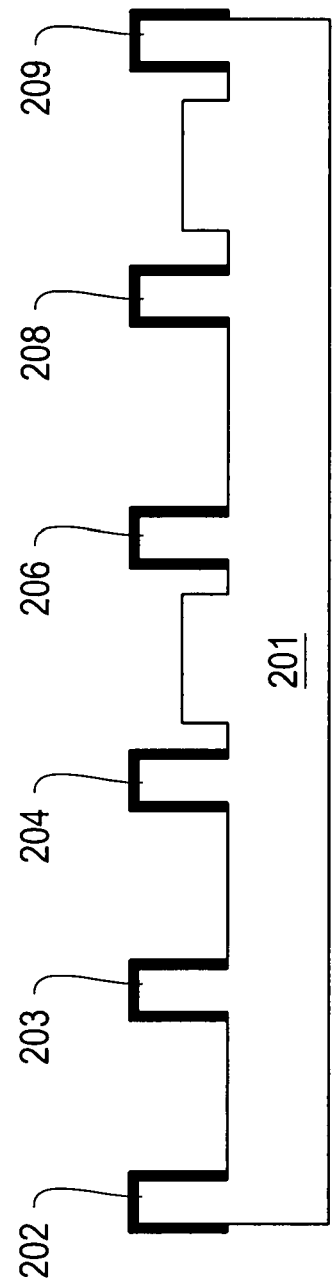
Figure 4A
Figure 4B

SYSTEMS AND METHODS FOR HIGH DENSITY MULTI-COMPONENT MODULES

CROSS-REFERENCE RELATED APPLICATION

This application claims the benefit of U.S. Provisional Application Ser. No. 60/796,488, filed May 1, 2006, the entire contents of which are incorporated herein by reference.

FIELD OF INVENTION

The invention relates generally to systems and methods for fabricating high density multi-component modules.

BACKGROUND OF THE INVENTION

There is an increasing drive to integrate more devices with disparate capabilities into a single vanishingly-small package. This trend is driven by both consumer electronics and government applications, in which robust, long-life systems must perform continuous monitoring in hostile environments in order to supplement scarce human intelligence resources.

For example, electronic systems such as portable wireless communication devices or portable clinical diagnostic kits may require the integration of multiple capabilities, such as robust computational power, accurate imaging, guidance and navigation, biochemical detection, and robust and secure communications into a single package.

Traditionally, system and packaging design largely decouples the system components and addresses their development in parallel. This results in larger than optimal and power-inefficient systems. These are typically packaged individually into separate modules, wherein a module generally refers to a single substrate, interposer, or other support structure, with one or more components disposed thereon, with functional interconnections that couple the components to other devices.

In certain instances, multiple components may be packaged into a single module, but these components are typically all of the same technology type (i.e. all are digital integrated circuits, all are memory chips, etc.), all of the same material (i.e. a silicon communication layer stacked with a silicon imaging layer), or consist of a limited number of active devices (<5) packaged with a small number of passives (<10).

In order to approach the theoretical maximum component density and power efficiency for arbitrary materials, large numbers of components, and arbitrary interconnection paths (e.g. horizontal and vertical), the specification and design of the constituent subsystems must be conducted in a highly optimized and coupled manner. Additionally, the integration method must overcome the host of thermophysical incompatibilities encountered when interconnecting the platforms into a single device.

SUMMARY OF THE INVENTION

The invention addresses the deficiencies in the prior art by providing devices a subsystem packaging and interconnection method that incorporates a multitude of subsystem components and materials into a single platform. In one aspect, the invention provides a method of forming a device by which very high aspect ratio interconnecting structures are initially formed in a matrix through one of several possibilities.

In another aspect, the invention provides a device that incorporates several subsystem components on a single platform. The components can perform a wide variety of functions, and in certain embodiments include analog or digital integrated circuit components, wireless communication components such as radio frequency receivers and transmitters, optical signal processors, optical routing elements including waveguides, biological and chemical sensors, transducers, actuators, energy sources, MEMS devices, passive components, and other components that will be discussed in more detail below. In certain embodiments, a manufacturer incorporates nanoparticles into the materials that make up the device. The nanoparticles can be incorporated throughout the material to globally alter the materials' properties, but in other embodiments, the nanoparticles are introduced in certain regions near a subsystem component to improve the performance of that component, or in certain regions to serve as a subsystem component formed directly within the materials of the device.

In another aspect, the invention relates to a method of forming a device by which a first set of components arranged above a first substrate, a first encapsulating layer encapsulating the first set of components on the first substrate, is combined with a second set of components arranged over a second substrate, a second encapsulating layer encapsulating the second set of components on the second substrate, wherein at least one functional interconnect for interconnecting at least one of the second set of components with at least one of the first set of components.

In another aspect, the invention includes a device, comprising a substrate, a first set of components arranged above the substrate, a first encapsulating layer over the first set of components, a second set of components arranged above the first set of components, wherein the second set of components are predefined, a second encapsulating layer disposed over and encapsulating the second set of components and at least partially contacting the first encapsulating layer, and at least one functional interconnect for interconnecting at least one of the second set of components with at least one of the first set of components.

BRIEF DESCRIPTION OF THE FIGURES

The foregoing discussion will be understood more readily from the following detailed description of the invention with reference to the following drawings. The drawings may not be drawn to scale.

FIG. 4A is a cross sectional view of components used to form the multi-component module of FIG. 1 after a second stage of manufacture, according to an illustrative embodiment of the invention.

FIG. 4B is a cross sectional view of components used to form the multi-component module of FIG. 1 after a third stage of manufacture, according to an illustrative embodiment of the invention.

DESCRIPTION OF CERTAIN ILLUSTRATIVE EMBODIMENTS

The invention, in various embodiments, provides devices and methods for multi-component modules and/or methods of manufacturing multi-component modules. The following detailed description of the invention refers to the accompanying drawings.

Figure 1:
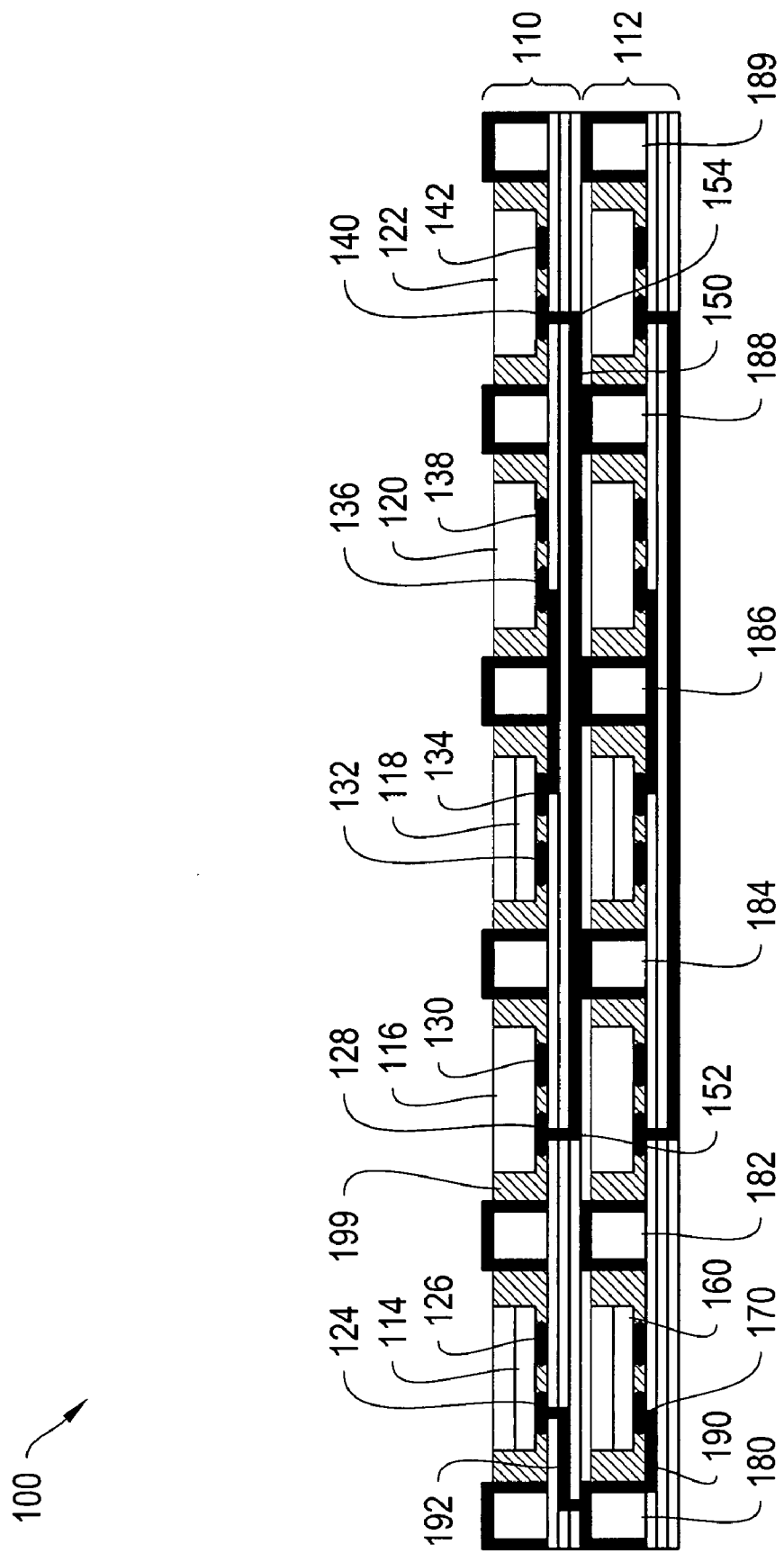
FIG. 1 is a cross sectional view of a multi-component module according to an illustrative embodiment of the invention.

FIG. 1 is a cross sectional view of a multi-component module according to an illustrative embodiment of the invention. The device 100 has two layers 110 and 112. The two layers 110 and 112 are bonded together to form the device 100.

Layer 110 has five modules 114, 116, 118, 120, and 122. In the illustrative embodiment, modules 114, 116, 118, 120, and 122 are dies. The dies 114, 116, 118, 120, and 122 are encapsulated by an encapsulating polymer 199. The dies 114, 116, 118, 120, and 122 feature metal contacts 124, 126, 128, 130, 132, 134, 168, 138, 140, and 142. The metal contacts 124, 126, 128, 130, 132, 134, 168, 138, 140, and 142 are interconnected with metal contacts on other modules, as required. In the illustrative embodiment, metal contact 128 is interconnected to metal contact 140 by means of interconnect 150 and vias 152 and 154.

Modules are also interconnected between layers, as required, using metal or metal-coated posts 180, 182, 184, 186, 188, and 189. In the illustrative embodiment, metal contact 170 of die 160 on layer 112 is interconnected with post 180 by interconnect 190. Post 180 is further interconnected with metal contact 124 of die 114 on layer 110 by interconnect 192.

In the illustrative embodiment, layers 110 and 112 are identical. In other embodiments, the modules may have different lengths, widths, and thicknesses. The modules may include integrated circuits, semiconductor dies, microfluidics, optical components. The modules may also be fabricated in different technology types. For example, a multi-component module may include an RF module fabricated in GaAs and a digital signal processor module fabricated in Si.

In other embodiments, the device may include only one layer. In other embodiments, the device may include more than two layers. The invention does not limit the number of layers a manufacturer may include in a device.

Figure 2:
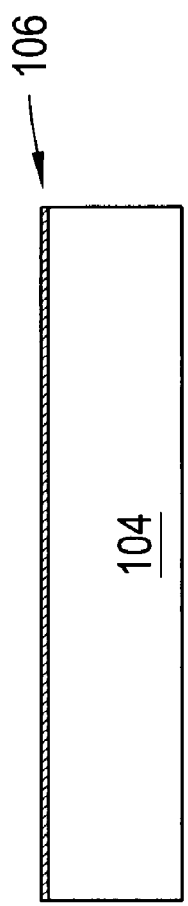
FIG. 2 is a cross sectional view of components used to form the multi-component module of FIG. 1 at a first stage of manufacture, according to an illustrative embodiment of the invention.
Figure 2:
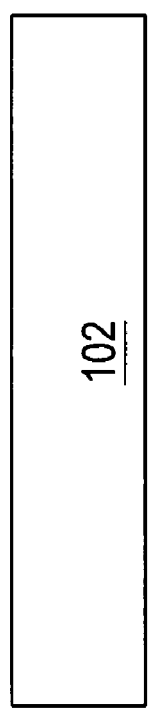

FIG. 2 is a cross sectional view of components used to form the multi-component module of FIG. 1 at a first stage of manufacture, according to an illustrative embodiment of the invention. A manufacturer generally begins the process of manufacturing a multi-component module with a silicon wafer 102 and a temporary carrier 104 with a sticky surface 106.

Figure 3:
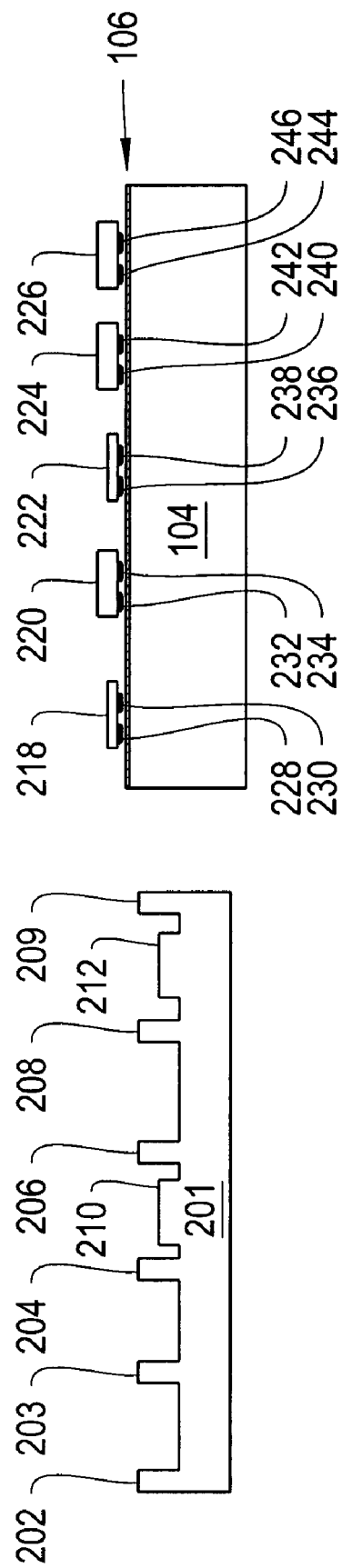
FIG. 3 is a cross sectional view of components used to form the multi-component module of FIG. 1 after a first stage of manufacture, according to an illustrative embodiment of the invention.

FIG. 3 is a cross sectional view of components used to form the multi-component module of FIG. 1 after a first stage of manufacture, according to an illustrative embodiment of the invention. Referring to FIGS. 2 and 3, in the first stage of manufacturing, the manufacturer etches the wafer 102, resulting in wafer 201. The etching process forms posts 202, 203, 204, 206, 208, and 209. The manufacturer may optionally etch die plinths 210 and 212 if the dies to be packaged in a subsequent step on wafer 201 are of non-uniform thickness.

The manufacturer then positions dies 218, 220, 222, 224, and 226 face down such that the electrical contacts 228, 230, 232, 234, 236, 238, 240, 242, 244, and 246 make adhere to the sticky surface 106 of the temporary carrier 104. In certain embodiments, dies 218, 220, 222, 224, and 226 have non-uniform dimensions.

In one embodiment, the posts 202, 203, 204, 206, 208, and 209 of the wafer 201 may have a very high aspect ratio. In a certain embodiment, very high aspect ratio posts may be formed by depositing metal into a polymer mold deposited on the surface of the wafer.

In another embodiment, the posts 202, 203, 204, 206, 208, and 209 of the wafer 201 may have a low aspect ratio. In this embodiment, the dies 218, 220, 222, 224, and 226 may have a thickness of less than 50 µm.

In alternative embodiments, the manufacturer fabricates posts by first depositing a polymer mold on a substrate. The mold features post-shaped voids, as required. Next, metal posts are fabricated on the substrate using standard techniques for depositing metal such as electroforming, electroless plating, chemical vapor deposition, physical vapor deposition. Then, the polymer mold is removed, leaving behind only the solid metal posts.

FIG. 4A is a cross sectional view of components used to form the multi-component module of FIG. 1 after a second stage of manufacture, according to an illustrative embodiment of the invention. Referring to FIGS. 3 and 4A, in the second stage of manufacturing, after the posts 202, 203, 204, 206, 208, and 209, are formed, the manufacturer deposits a photoresist layer 322. After patterning the photoresist layer 322 using standard photolithography techniques, the manufacturer deposits a metallization layer 320 covering the surface of the wafer 201, the posts 202, 203, 204, 206, 208, and 209, and the die plinths 210 and 212. Metallization layer 320 may be deposited by different methods, including electroforming, electroless plating, chemical vapor deposition, or physical vapor deposition.

In another embodiment, insulating and conducting layers are sequentially deposited and photopatterned to form interconnections between posts, as required, using standard photolithography techniques. In embodiments where the substrate is insulating, it may not be necessary to deposit an insulating layer.

FIG. 4B is a cross sectional view of components used to form the multi-component module of FIG. 1 after a third stage of manufacture, according to an illustrative embodiment of the invention. Referring to FIGS. 4A and 4B, in the third stage of manufacturing, after depositing metallization layer 320, the manufacturer removes the photoresist layer 322, lifting off the metallization layer 320 everywhere except from the posts 202, 203, 204, 206, 208, and 209. The metallized posts 202, 203, 204, 206, 208, and 209 will be used to form vias in a subsequent step in the process flow.

Figure 5A:
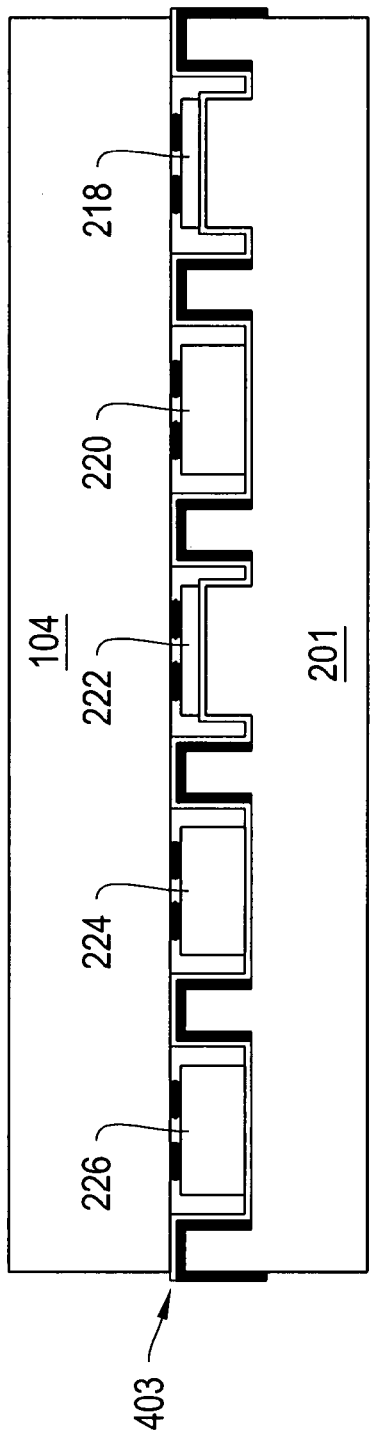
FIG. 5A is a cross sectional view of components used to form the multi-component module of FIG. 1 after a fourth stage of manufacture, according to an illustrative embodiment of the invention.

FIG. 5A is a cross sectional view of components used to form the multi-component module of FIG. 1 after a fourth stage of manufacture, according to an illustrative embodiment of the invention. Referring to FIGS. 4B and 5A, in the fourth stage of manufacturing, the manufacturer deposits an adhesive layer 403 onto wafer 201. Then, the manufacturer positions the temporary carrier 104 relative to the wafer 201 and brings the temporary carrier 104 and the wafer 201 into physical contact. The dies 226, 224, 222, 220, and 218 are transferred to the adhesive layer 403 on the wafer 201 from the temporary carrier 104, on which dies 226, 224, 222, 220, and 218 were previously affixed face down, as was depicted in FIG. 2.

Figure 5B:
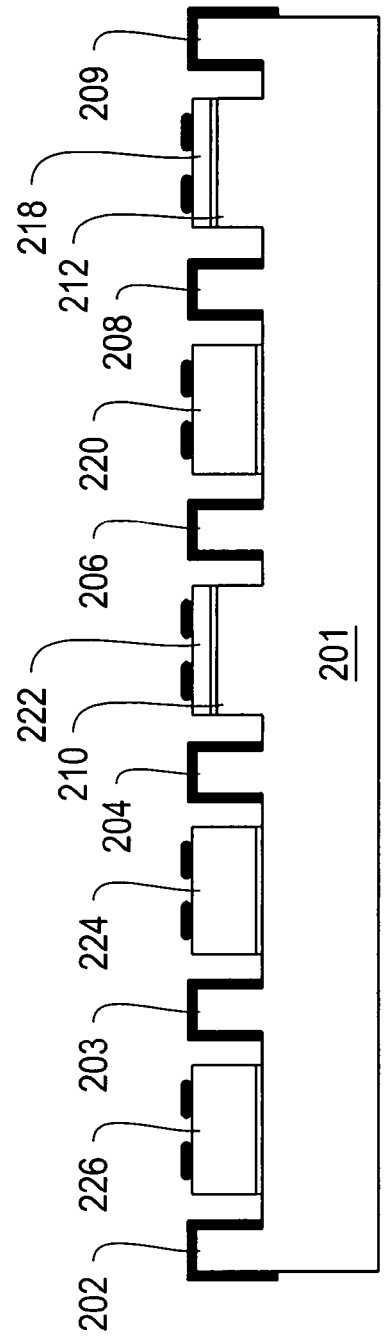
FIG. 5B is a cross sectional view of components used to form the multi-component module of FIG. 1 after a fifth stage of manufacture, according to an illustrative embodiment of the invention.

FIG. 5B is a cross sectional view of components used to form the multi-component module of FIG. 1 after a fifth stage of manufacture, according to an illustrative embodiment of the invention. Referring to FIGS. 5A and 5B, in the fifth stage of manufacturing, next, the temporary carrier 104 is removed from the dies 226, 224, 222, 220, and 218, leaving them affixed to the wafer 201. The adhesive layer is then removed from the wafer 201, leaving only the layer affixing the dies 226, 224, 222, 220, and 218 to the wafer.

Figure 6:
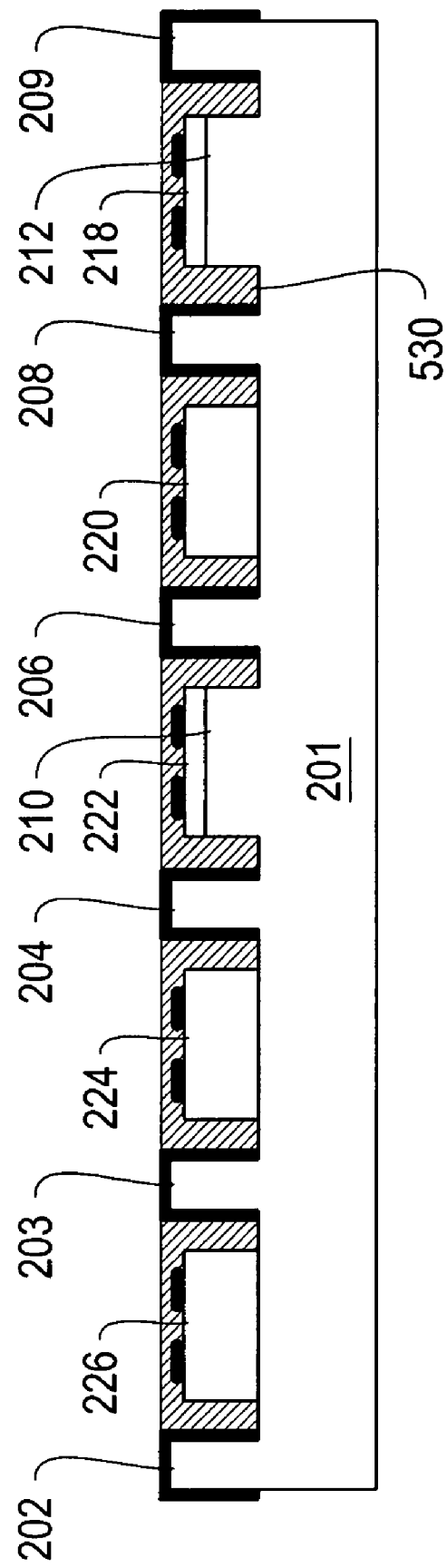
FIG. 6 is a cross sectional view of components used to form the multi-component module of FIG. 1 after a sixth stage of manufacture, according to an illustrative embodiment of the invention.

FIG. 6 is a cross sectional view of components used to form the multi-component module of FIG. 1 after a sixth stage of manufacture, according to an illustrative embodiment of the invention. Referring to FIGS. 5B and 6, in the sixth stage of manufacturing, after the dies are affixed to the wafer 201, an encapsulating polymer 530 is flowed onto the wafer, at least partially encapsulating the dies 226, 224, 222, 220, and 218. In one embodiment, the polymer 530 is screen printed. In another embodiment, the polymer 530 is stenciled. In yet another embodiment, the polymer 530 is spray-coated inside a dam area. Once the polymer 530 is deposited on the wafer 201, it is cured.

Figure 7:
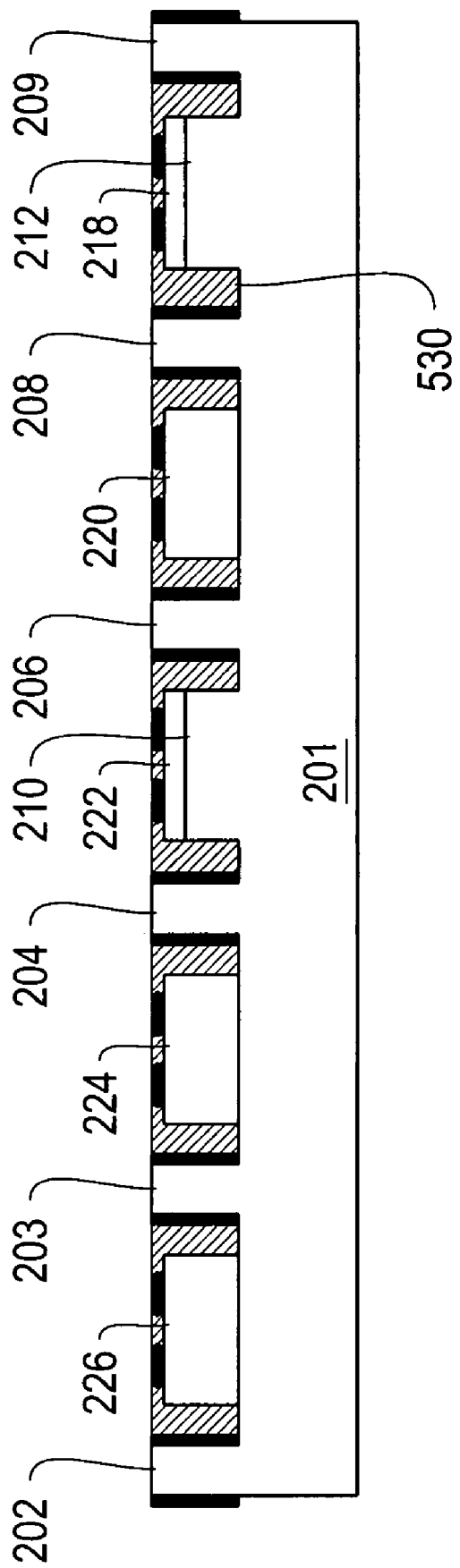
FIG. 7 is a cross sectional view of components used to form the multi-component module of FIG. 1 after a seventh stage of manufacture, according to an illustrative embodiment of the invention.

FIG. 7 is a cross sectional view of components used to form the multi-component module of FIG. 1 after a seventh stage of manufacture, according to an illustrative embodiment of the invention. Referring to FIGS. 6 and 7, in the seventh stage of manufacturing, the top of the wafer 201 is planarized so that the heights of the posts 202, 203, 204, 206, 208, and 209 are equal to the height of the encapsulant 530 and encapsulated dies 226, 224, 222, 220, and 218, thereby exposing metal contacts 709-718 of dies 226, 224, 222, 220, and 218. In one embodiment, the wafer 201 is planarized by means of Chemical Mechanical Planarization (CMP).

Figure 8:
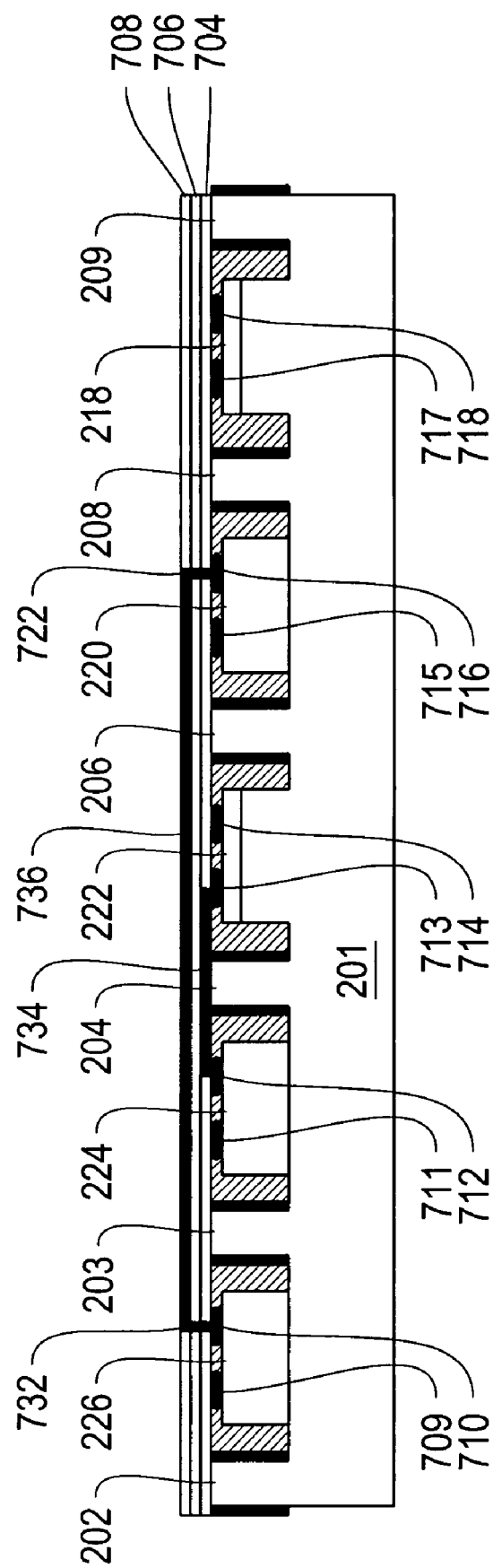
FIG. 8 is a cross sectional view of components used to form the multi-component module of FIG. 1 after a eighth stage of manufacture, according to an illustrative embodiment of the invention.

FIG. 8 is a cross sectional view of components used to form the multi-component module of FIG. 1 after a eighth stage of manufacture, according to an illustrative embodiment of the invention. Referring to FIGS. 7 and 8, in the eighth stage of manufacturing, the manufacturer then fabricates one or more dielectric layers, such as layers 704, 706, and 708, on top of the wafer 201. In one embodiment, the dielectric layers are patterned to form electrical interconnections 734 and 736 to the dies 226, 224, 222, 220, and 218 and to the posts 202, 203, 204, 206, 208, and 209, as required. In another embodiment, the dielectric layers are also patterned to form resistors, capacitors, inductors, and other functional components. The manufacturer then fabricates vias 722 and 732 to connect the interconnects 734 and 736 to the dies 226, 224, 222, 220, and 218, as required.

Figure 9:
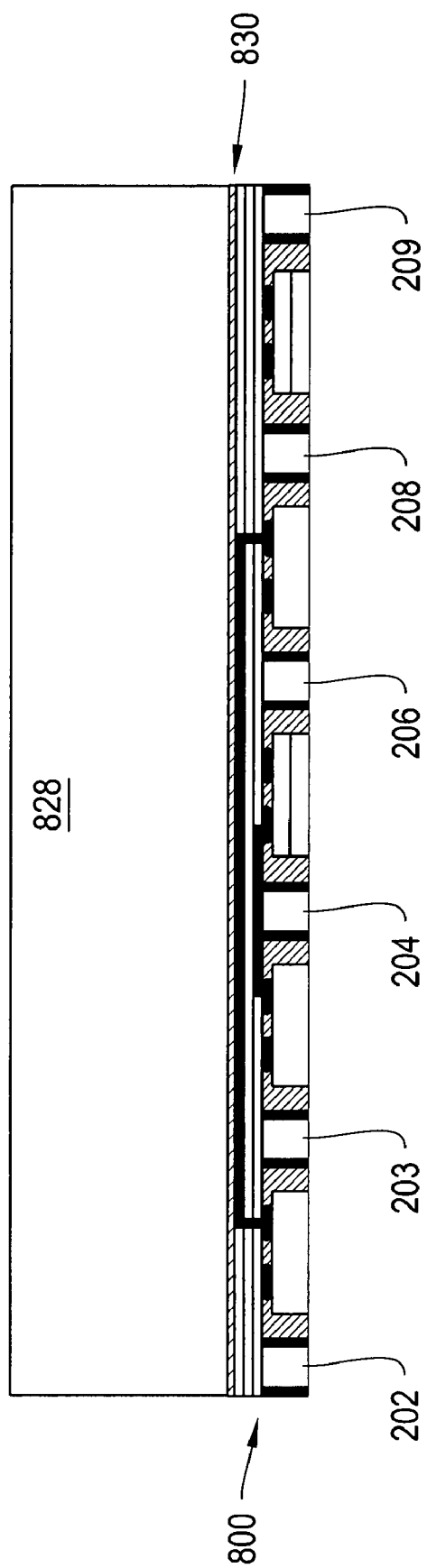
FIG. 9 is a cross sectional view of components used to form the multi-component module of FIG. 1 after a ninth stage of manufacture, according to an illustrative embodiment of the invention.

FIG. 9 is a cross sectional view of components used to form the multi-component module of FIG. 1 after a ninth stage of manufacture, according to an illustrative embodiment of the invention. Referring to FIGS. 8 and 9, in the ninth stage of manufacturing, after the interconnect layers are fabricated, the topside of the device 800 is attached to a temporary carrier 828 by means of an adhesive layer 830. The backside of the device 800 is then planarized until the metallized layers on the posts 202, 203, 204, 206, 208, and 209 are exposed. Preferably, CMP is used to planarize the device 800. In various other embodiments, mechanical planarization, chemical planarization, plasma etching, or a combination is used to planarize the backside of the device 800.

Figure 10:
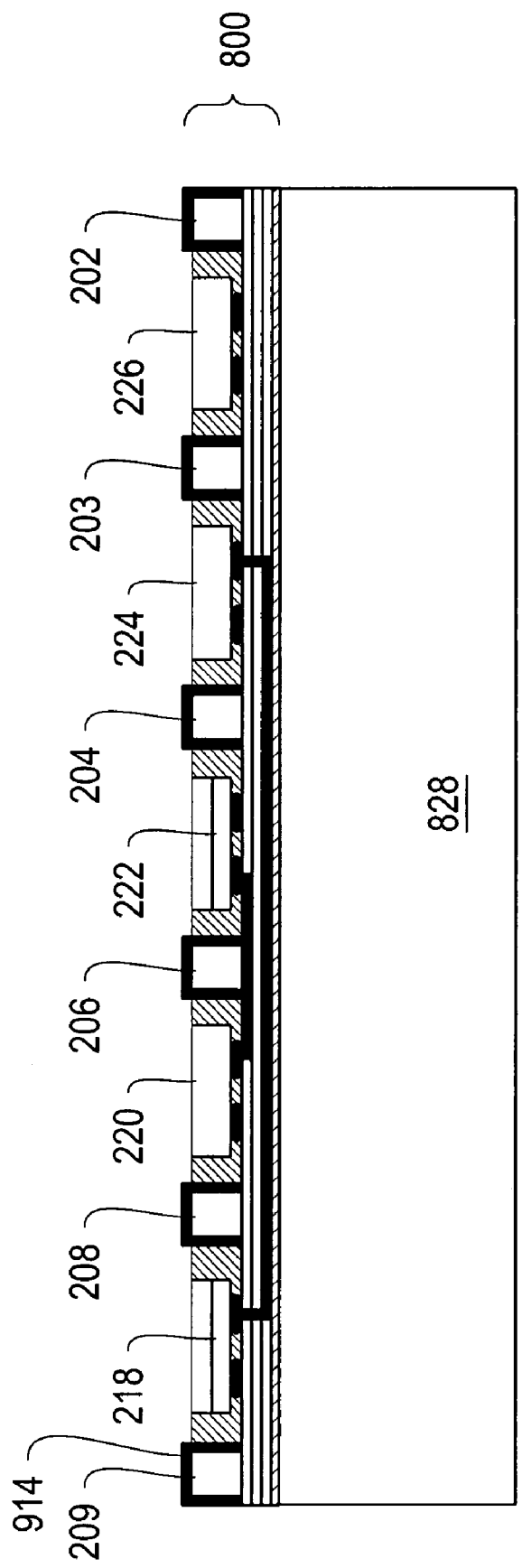
FIG. 10 is a cross sectional view of components used to form the multi-component module of FIG. 1 after a tenth stage of manufacture, according to an illustrative embodiment of the invention.

FIG. 10 is a cross sectional view of components used to form the multi-component module of FIG. 1 after a tenth stage of manufacture, according to an illustrative embodiment of the invention. Referring to FIGS. 9 and 10, in the tenth stage of manufacturing, the manufacturer deposits a metal layer 914 on the surface of the device 800. In the illustrative embodiment, metal layer 914 is depicted above posts 202, 203, 204, 206, 208, and 209. In other embodiments, the metal layer may be patterned and deposited to form interconnects on any portion of the surface of the device 800, as required.

At this step in the process flow, the device 800 features dies 226, 224, 222, 220, and 218 encapsulated and interconnected with each other and with posts 202, 203, 204, 206, 208, and 209, as required.

Figure 11:
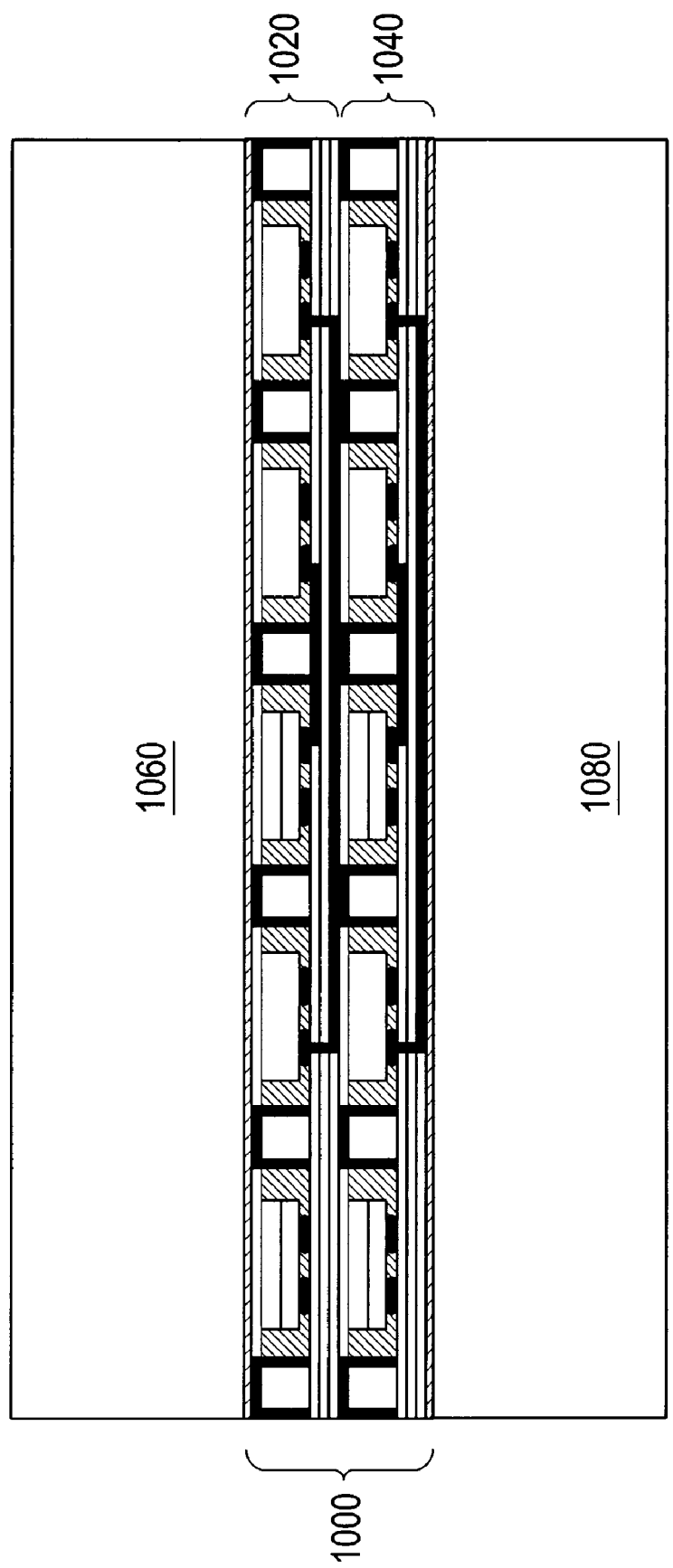
FIG. 11 is a cross sectional view of the multi-component module of FIG. 1 after an eleventh stage of manufacture, according to an illustrative embodiment of the invention.

FIG. 11 is a cross sectional view of the multi-component module of FIG. 1 after an eleventh stage of manufacture, according to an illustrative embodiment of the invention. Referring to FIGS. 10 and 11, in the eleventh stage of manufacturing the manufacturer may optionally bond two devices to form a single package. Two devices 1020 and 1040 are positioned relative to each other so that the interconnects of device 1020 are aligned with the interconnects of device 1040. The devices 1020 and 1040 are then bonded together to form device 1000. After bonding, the temporary carriers 1060 and 1080 are removed, leaving only the device 1000.

In various embodiments, the devices 1020 and 1040 may be bonded by adhesive, by solder, by solid-state thermocompression, by transient liquid phase bonding, by anodic bonding, or by other standard wafer bonding techniques. In other embodiments, mechanical stress compensation methods may be integrated into the bonding process.

In other embodiments, the devices 1020 and 1040 may be bonded in a back-to-back configuration or a back-to-front configuration.

In other embodiments, an interposer layer may separate the devices 1020 and 1040. Devices 1020 and 1040 may each be bonded to an interposer layer. The interposer layer may provide mechanical support. The interposer layer may also have components integrated into it or onto it.

In other embodiments, the manufacturer may optionally repeat the steps depicted in FIGS. 2-10 to create additional devices like the device 800. Then, manufacturer may bond all of the devices into a single package.

Figure 12:
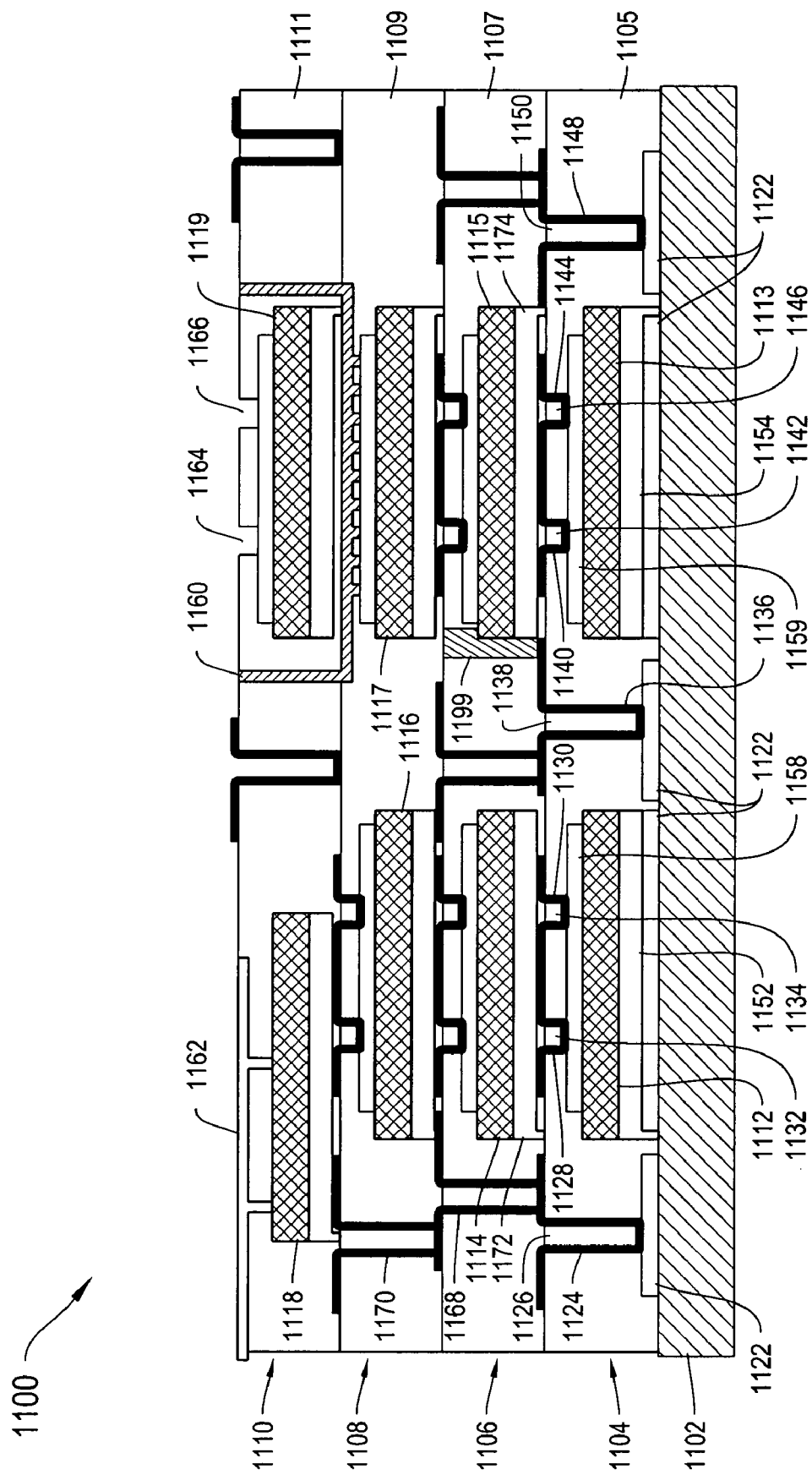
FIG. 12 shows layered multi-component device 1100 according to an alternative illustrative embodiment of the invention.

FIG. 12 shows layered multi-component device 1100 according to an alternative illustrative embodiment of the invention. The device generally includes a multi-component substrate 1102 that supports four layers 1104, 1106, 1108, and 1110 of subsystem components 1112-1119. As shown, layer 1104 includes a first set of components 1112 and 1113, layer 1106 includes a second set of components 1114 and 1115, layer 1108 includes a third set of components 1116 and 1117, and layer 1110 includes a fourth set of components 1118 and 1119. As will be discussed below, the components 1112-1119 are packaged and functionally interconnected within the single device 1100 on a single multi-component substrate 1102 that underlies the plurality of layers 1104, 1106, 1108, and 1100. Each of these components 1112-1119 can serve a variety of functions.

In addition, each of the layers 1104, 1106, 1108, and 1110 includes metallization layers and cross-layer interconnects for providing electrical connections among components within a single layer, and among components across multiple layers. By way of example, layer 1104 includes a metallization layer 1122 for providing electrical connections among components 1112 and 1113 in layer 1104, and optionally for providing electrical connections between components 1112 and 1113 and electrical ground or power (i.e., for providing the components 1112 and 1113 with the voltage differential provided by a power source, not shown).

Layer 1104 also includes cross-layer interconnects 1128, 1130, 1140, and 1144 and metallization layers 1158 and 1159 for providing electrical connections between components 1114 and 1115 of layer 1106 and components 1112 and 1113 of layer 1104. More particularly, interconnects 1128 and 1130 electrically connect components 1114 and 1112 via metallization layer 1158, while interconnects 1140 and 1144 electrically connect components 1113 and 1115 via metallization layer 1159. Interconnects can also electrically connect components across multiple layers. For example, interconnects 1124, 1168, and 1170 electrically connect the metallization layer 1122, the component 1116, and the component 1118.

Each of the layers 1104, 1106, 1108, and 1110 also includes adhesive layers for affixing the components 1112-1119 to the device 1100. For example, layer 1104 includes adhesive layer 1152 for affixing component 1112 to the multi-component substrate 1102, and adhesive layer 1154 for affixing component 1113 to multi-component substrate 1102. Similarly, layer 1106 includes adhesive layers 172 and 174 for affixing components 1114 and 1115 above the layer 1104. Also shown in FIG. 12 is an optical waveguide 1162, microfluidic channels 1160, 1164, and 1166, and a stress relieving feature 1199, whose functions will be discussed in more detail below.

Finally, the above-mentioned structures in each of the layers 1104, 1106, 1108, and 1110 are disposed within and mechanically supported by respective encapsulant layers 1105, 1107, 1109, and 1111. A more detailed discussion of these structures and a method of manufacturing device 1100 now follows with respect to FIGS. 13 and 14A.

Figure 13:
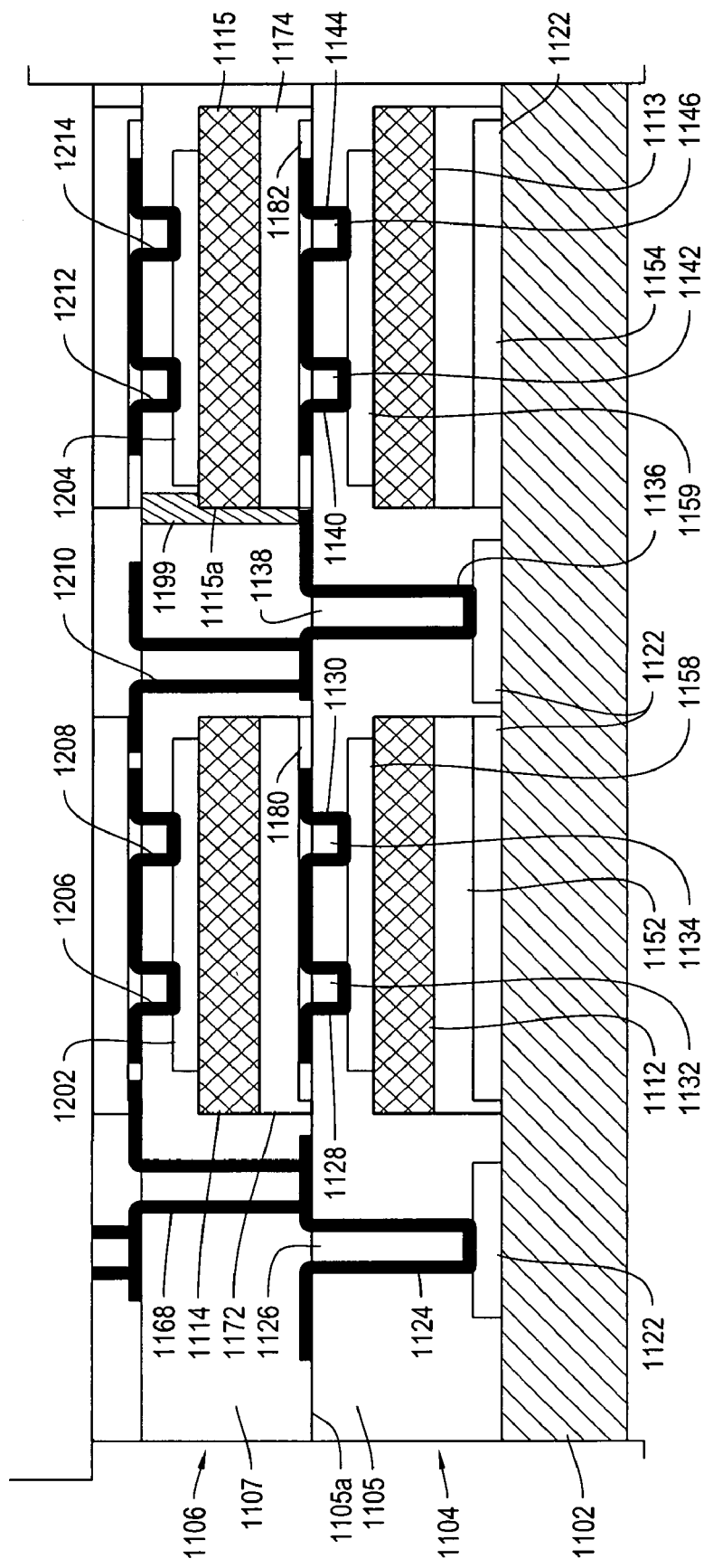
FIG. 13 shows a close-up view of the device 1100 of FIG. 12.
Figure 14A:
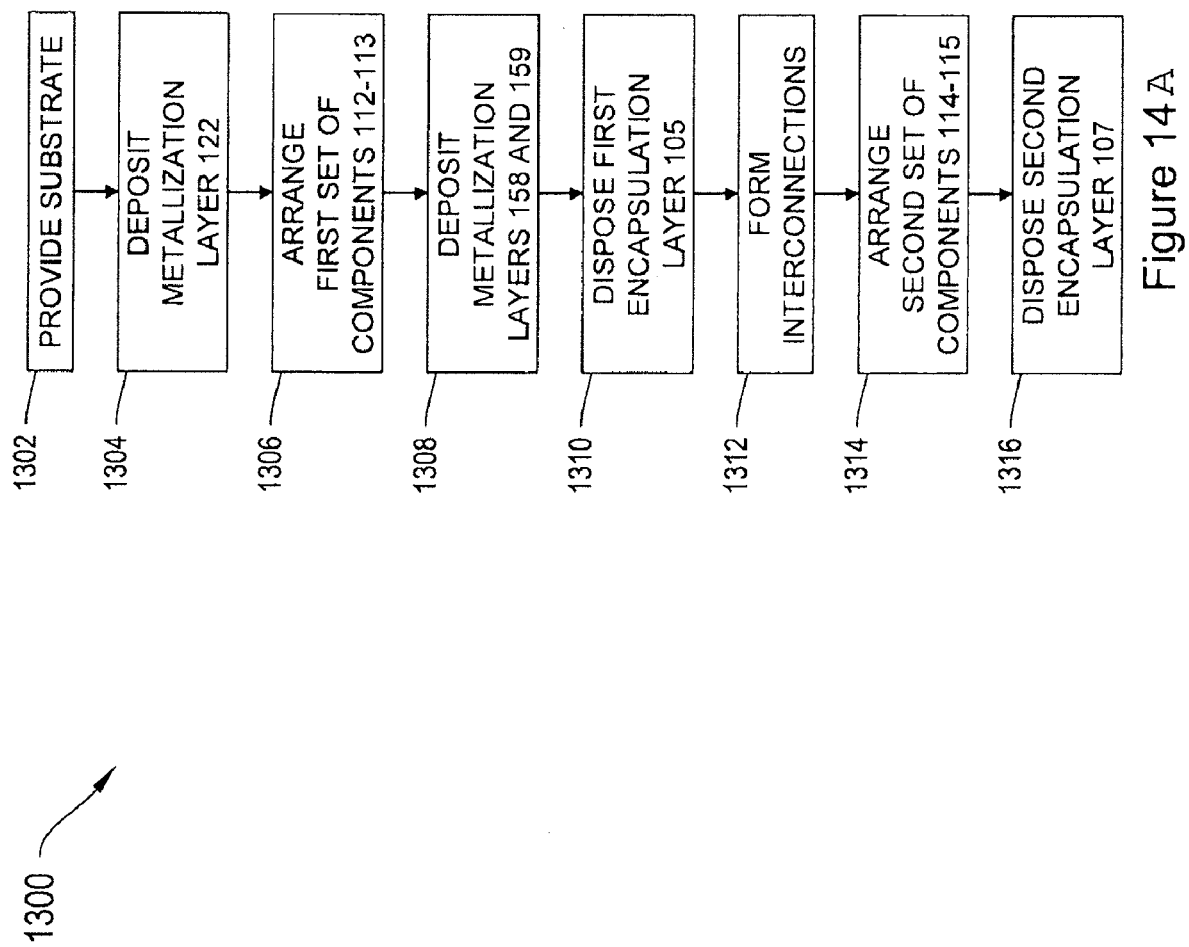
FIG. 14A shows a flow diagram depicting a method 1300 of fabricating the device of FIG. 12, according to an illustrative embodiment of the invention.
Figure 14B:
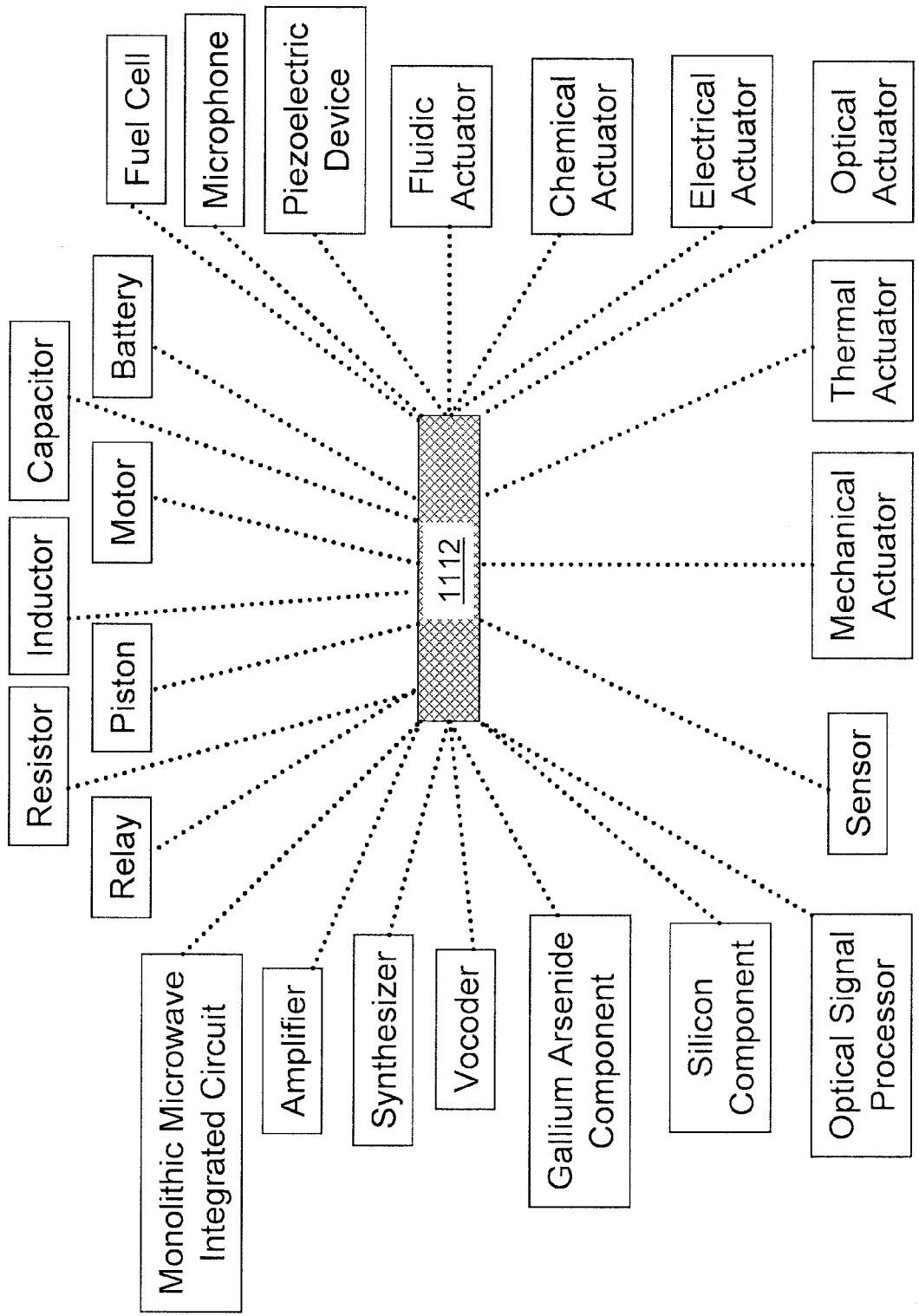
FIG. 14B shows a number of exemplary components that may be utilized in various embodiments of the invention.

FIG. 13 shows a close-up view of the device 1100 of FIG. 12. FIG. 14A shows a flow diagram depicting a method 1300 of fabricating the device of FIG. 12, according to an illustrative embodiment of the invention. The manufacturer generally deposits the layers 1104, 1106, 1108, and 1110 sequentially. One exemplary manufacturing technique for each of the layers 1104, 1106, 1108, and 1110 is similar, and with respect to the exemplary layer 1104, proceeds in five phases: first, the manufacturer provides the multi-component substrate 1102 and deposits the metallization layer 1122 thereon; second, the manufacturer affixes the components 1112 and 1113 via adhesive layers 1152 and 1154; third, the manufacturer deposits metallization layers 1158 and 1159; fourth, the manufacturer deposits and forms the encapsulating layer 1105; and fifth, the manufacturer forms the interconnects 1124, 1128, 1130, 1136, 1140, and 1144.

More particularly, the manufacturer first provides the multi-component substrate 1102 (step 1302 of FIG. 14A). The multi-component substrate 1102 may be made of a non-conductive material, and in certain embodiments is made of a semiconductor, a ceramic, and/or a polymer.

Next, the manufacturer deposits the metallization layer 1122 (step 1304) on the multi-component substrate 1102. The manufacturer may use thin film deposition techniques such as plating, chemical vapor deposition, laser deposition, sputtering, vacuum evaporation, or by firing from an ink or paste formulation, whereby the ink or paste is deposited by means of needle dispense, screen-printing, and immersion or dip coating. The manufacturer then patterns the metallization layer 1122 in accordance with a desired interconnection pattern of the components 1112-1113 of layer 1104 using patterning methods such as, for example, lithography, etching, or any of the other patterning methods described herein or known in the art.

After depositing the metallization layer 1122, the manufacturer arranges and affixes the first set of components 1112 and 1113 via adhesive layers 1152 and 1154 (step 1306). The manufacturer may optionally deposit a thin film dielectric layer (not shown) over the metallization layer 1122 to insulate the metallization layer 1122 from the components 1112 and 1113. In the depicted embodiment, adhesive bonding layers 1152 and 1154 are disposed between the metallization layer 1122 and the components 1112 and 1113. In one exemplary technique, the manufacturer applies the adhesive layers 1152 and 1154 directly over the multi-component substrate 1102 and/or the metallization layer 1122, and then aligns and presses the components 1112 and 1113 to affix the components 1112 and 1113 to the adhesive layers 1152 and 1154. The adhesive layers 1152 and 1154 may be liquid adhesives or solid adhesives, such as tape adhesives. Although the depicted adhesive layers 1152 and 1154 cover substantially all of the lower surfaces of the components 1112 and 1113, this need not be the case. The adhesive layers 1152 and 1154 may be disposed such that the metallization layer 1122 electrically contacts the components 1112 and 1113.

After depositing the components 1112 and 1113, the manufacturer deposits and optionally patterns metallization layers 1158 and 1159 using any of the techniques described herein (step 1308). Next, the manufacturer disposes the first encapsulation layer 1105 over and laterally between the components 1112 and 1113 (step 1310). In one exemplary technique, the encapsulating layer 1105 is a thermoplastic material so that it can be first flowed onto the device 1100 in liquid phase, then soft baked to be solid but pliable upon heating, then planarized, and finally hard baked to become integral with the device 1100. These steps will be discussed in more detail below.

The encapsulation layer 1105 may be a dielectric polymer material. In certain embodiments, the encapsulation layer is an epoxy. The layer 1105 may be a photosensitive material so that physical features can be photo-defined within the layer 1105. However, in other embodiments, the encapsulating layer 1105 is a non-photosensitive material. In certain embodiments, the encapsulating layer 1105 is an amorphous material. The encapsulating layer 1105 may be a polycrystalline material or a monocrystalline material. In certain embodiments, the encapsulating layer 1105 has a Young's modulus of between about 0.5 GPa and about 5 GPa so that the material can provide both elasticity to withstand stresses, and structural integrity to support the various components and features disposed therein. The encapsulating layer 1105 may have a coefficient of thermal expansion of between about 3 ppm per Celsius degree and about 60 ppm per Celsius degree to help the device 1100 withstand the stresses of thermal cycling. In certain embodiments, as will be discussed in more detail below, the encapsulating layer 1105 serves as a transmission medium for optical signals. As such, in these embodiments, the encapsulating layer 1105 is transparent for certain wavelengths of light, such as wavelengths greater than about 350 nm. In certain embodiments, the encapsulating layer includes at least one of polymethyl methacrylate, polyimide, and benzocyclobutenes. In certain embodiments, the encapsulating layer is made of SU-8.

As mentioned above, the encapsulating layer 1105 can be flowed over the multi-component substrate 1102 and components 1112 and 1113 in a liquid or paste-like phase. The encapsulating layer 1105 may be flowed onto the device 1100 using, for example, needle dispensing, spin coating, screen printing, spray coating, and/or chemical vapor deposition. Next, the manufacturer soft bakes the device to solidify the encapsulating layer 1105 and, optionally, to remove solvent from the encapsulating layer 1105. The manufacturer may soft bake the device 1100 at temperatures of between about 60 degrees C. and about 130 degrees C., but may use higher or lower temperature that may depend on factors such as the material or the thickness of the encapsulating layer 1105. The manufacturer soft bakes the device 1100 until the encapsulating layer 1105 is a solid under room temperature conditions but is pliable/malleable when heated.

The manufacturer then heats the device 1100 so that the encapsulating layer 1105 is pliable/malleable, and then planarizes the upper surface 1105*a* of the encapsulating layer 1105. This may be done by pressing the upper surface 1105*a* with a planar surface and applying downward pressure. As an alternative, the manufacturer may use a chemical mechanical planarization (CMP) method to planarize the upper surface 1105*a* of the encapsulating layer 1105, in which case the encapsulating layer 1105 need not be reheated. In another embodiment, the manufacturer may use plasma etching.

Next, the manufacturer optionally hard bakes the device 1100. Hard baking may be beneficial at least in part to more completely cross-link the encapsulating layer 1105, to add mechanical strength to the encapsulating layer 1105, and to make the encapsulating layer 1105 more chemically inert. In one technique, the manufacturer bakes the device 1100 at a temperature of greater than about 150 degrees C., but may also choose a larger or smaller temperature. Additionally or alternatively, the manufacturer may expose the device to ultra-violet radiation to cross-link the encapsulating layer 1105.

As an alternative to depositing the encapsulating layer 1105, the encapsulating layer 1105 may be deposited in solid phase. In these techniques, the manufacturer defines cavities sized and shaped for interfitting with the components 1112 and 1113 within a solid encapsulating layer 1105, aligns the cavities with the components 1112 and 1113, and laminates the encapsulating layer 1105 to the multi-component substrate 1102.

After depositing the encapsulating layer 1105, the manufacturer forms the interconnects 1124, 1128, 1130, 1136, 1140, and 1144 (step 1312) and, in certain embodiments, these interconnects will functionally interconnect at least one component of the first set of components 1112 and 1113 with at least one component of the second set of components 1114 and 1115 yet to be placed. The technique proceeds in two phases: first, the manufacturer defines vias 1126, 1132, 1134, 1138, 1142, and 1146, and then the manufacturer metallizes the vias 1126, 1132, 1134, 1138, 1142, and 1146. More particularly, the manufacturer defines the vias 1126, 1132, 1134, 1138, 1142, and 1146 using, for example, photolithography, laser ablation, milling, shearing, cutting, wet etching, dry etching, and/or deep reaction ion etching. In one aspect, the mechanical properties of the encapsulating layer 1105 allow for vias, such as the vias 1126 and 1138, to extend through the entire thickness of the layer 1104. In some embodiments, the aspect ratios of the vias 1126 and 1138 may be more than about 5:1, more than about 7:1, more than about 9:1, or larger. In other embodiments, featuring dies thinned to less than about 30 μm, the aspect ratios of the vias 1126 and 1138 may be as small as 1:1.

Next, the manufacturer metallizes the vias 1126, 1132, 1134, and 1138. In one exemplary technique, the manufacturer first places the device in a low pressure, or vacuum, environment, disposes metal over the vias 1126, 1132, 1134, and 1138, heats the device 1100, and allows at least some of the metal to flow (by, for example, capillary action) into the vias 1126, 1132, 1134, and 1138, and contact the metallization layers 1122, 1158, or 1159 as the case may be. The metal may be any conductive material. For example, in certain embodiments, the material includes indium, copper, platinum, gold, silver, and/or alloys thereof. After the above-described metallizing, certain portions of the interconnects 1124, 1128, 1130, and 1136 lie above the upper surface 1105*a* of the encapsulating layer 1105 in order to electrically contact other metallization layers, such as the depicted metallization layers 1180 for interconnects 1128 and 1130 or the metallization layer 1182 for the interconnects 1136, 1140, and 1144. The portions of the interconnects lying above the upper surface 1105*a* may also electrically contact other interconnects yet to be formed, such as interconnect 1168.

As mentioned above, the manufacturer forms the layers 1104, 1106, 1108, and 1110 sequentially. After forming the layer 1104, the manufacturer uses similar processes to form layer 1106. More particularly, the manufacturer deposits and patterns the metallization layers 1180 and 1182 over the encapsulating layer 1105. After depositing the metallization layer 1122, the manufacturer arranges and affixes the first second set of components 1114 and 1115 via adhesive layers 1172 and 1174 (step 1314). As was the case with layer 1104, the manufacturer may optionally deposit a thin film dielectric layer (not shown) over the metallization layers 1180 and 1182 to insulate the metallization layers 1180 and 1182 from the components 1114 and 1115. In the depicted embodiment, the adhesive bonding layers 1172 and 1174 are disposed between the metallization layers 1180 and 1182 and the components 1114 and 1115. In one exemplary technique, the manufacturer applies the adhesive layers 1172 and 1174 directly over the encapsulating layer 1105 and/or the metallization layers 1180 and 1182, and then aligns and presses the components 1114 and 1115 to affix the components 1114 and 1115 to the adhesive layers 1172 and 1174. The adhesive layers 1172 and 1174 may be disposed such that the metallization layer 1122 electrically contacts the components 1114 and 1115.

The manufacturer then deposits and optionally patterns metallization layers 1202 and 1204, disposes the second encapsulating layer 1107 (step 1316) over and laterally between the components 1114 and 1115, soft bakes the encapsulating layer 1107, planarizes the encapsulating layer 1107, and hard bakes the encapsulating layer 1107, and forms interconnects 1168, 1206, 1208, 1210, 1212, and 1214 using similar techniques to those described in connection with layer 1104.

The components 1112-1119 may have edges that form angular interfaces with the encapsulant. By way of example, component 1115 has edge 1115a that forms an angular interface with encapsulating layer 1107. This angular interface can stress and possibly crack the encapsulating layer 1107. In certain embodiments, the manufacturer selectively removes a portion 1199 of the encapsulating layer 1107 in order to remove the encapsulating layer around this angular interface. The manufacturer may leave the portion 1199 as an empty via, or fill it with a compliant material.

In certain configurations, the multi-component substrate 1102 is sacrificial, and in an optional final step, the manufacturer removes the multi-component substrate 1102. In one such exemplary technique, the multi-component substrate 1102 is dissolved. Additionally, it is noted that although device 1100 includes four layers 1104, 1106, 1108, and 1100, the manufacturer can include as many or as few layers as desired.

As mentioned above, and as depicted in FIG. 14W the components 1112-1119 can comprise a variety of subsystem components that serve a variety of functions. The components 1112-1119 may be predefined, in that they are individually fabricated before they are arranged within the device 1100. The components 1112-1119 may include integrated circuit devices. The integrated circuit devices may be digital integrated circuit devices or analog integrated circuit devices.

In certain implementations, the components 1112-1119 include components for communication, such as wireless communication or optical communication. The components may include radio frequency transmitters and/or radio frequency receivers. More generally, they may include radio frequency integrated circuits, or microwave integrated circuits. Additionally, or alternatively, the components may include optical signal processors including optical signal transmitters, such as light emitting diodes (LEDs), tunable diodes, or lasers, and optical signal receivers, such as photodiodes. Other components and structures for routing optical signals will be discussed in more detail below.

In certain embodiments, the components include sensors, such as mechanical sensors, thermal sensors, optical sensors, electrical sensors, and/or chemical sensors. As will be discussed in more detail below, the chemical sensors may be in fluid communication with external fluid samples via microfluidic channels for chemical sensing and analysis. Other exemplary sensors include accelerometers, tilt sensors, and gyroscopes.

The components may include transducers, such as actuators. Exemplary actuators include mechanical actuators, thermal actuators, optical actuators, electrical actuators, chemical actuators, and fluidic actuators. The transducers may also include motors, pistons, relays, microphones, piezoelectric devices, batteries, and/or fuel cells.

Although many of the possible component types mentioned above are active components, they may also be passive components. For example, the components may include inductors, capacitors, and/or resistors.

Figure 15:
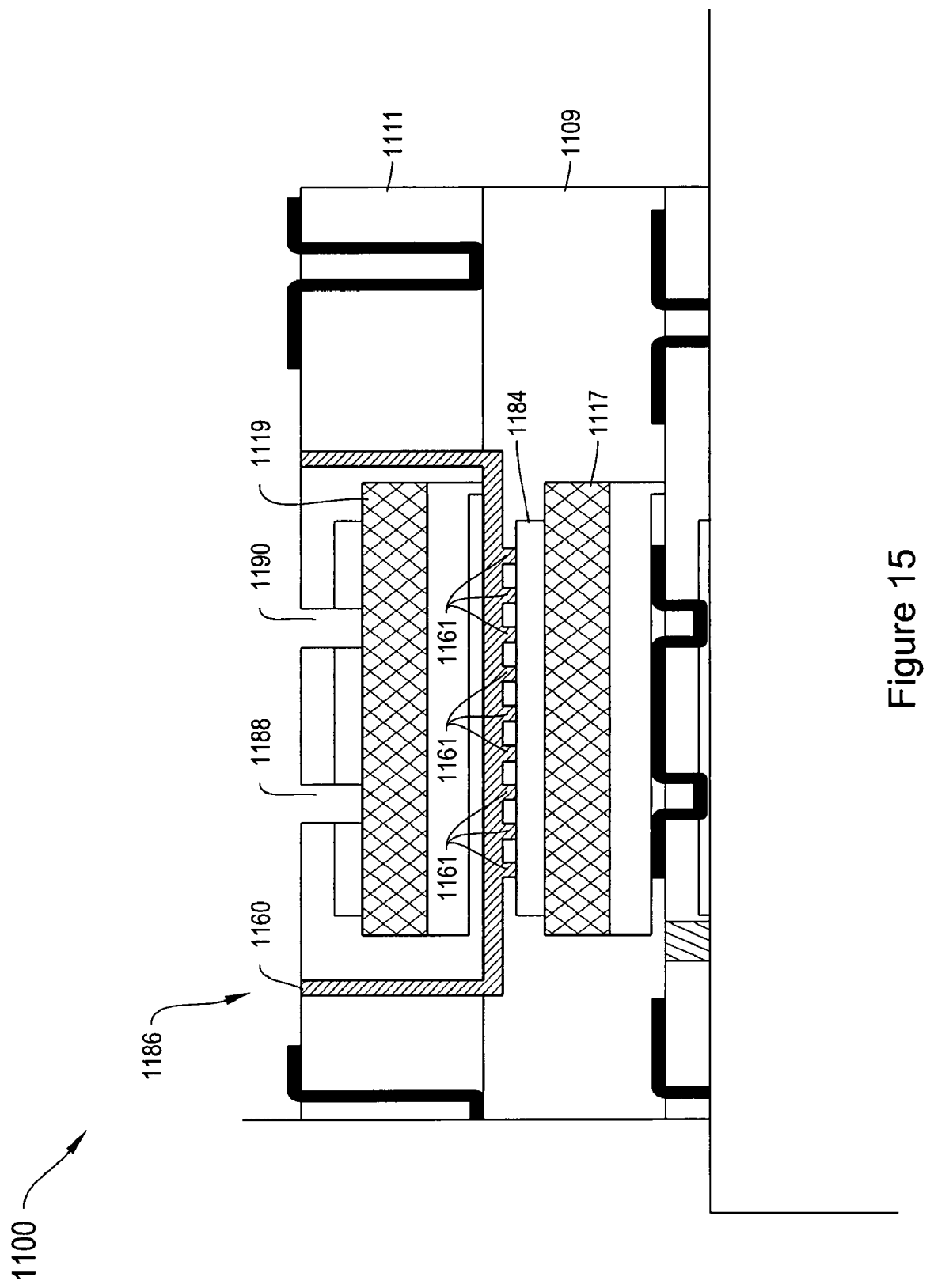
FIG. 15 shows a close-up view a second portion of the device 1100 of FIG. 12, and in particular shows microfluidic features for heat dissipation and for environmental sampling according to an illustrative embodiment of the invention.

FIG. 15 shows a close-up view a second portion of the device 1100 of FIG. 12, and in particular shows microfluidic features for heat dissipation and for environmental sampling according to an illustrative embodiment of the invention. More particularly, the depicted component 1117 generates heat and must be cooled to prevent overheating. The metallization layer 1184 couples to the component 1117, and a microfluidic heat dissipation channel 1160 is filled with gas or liquid and thermally couples the metallization layer 1184 to ambient air generally indicated at 1186. The heat dissipation channel 1160 draws heat away from the component 1117 and towards the ambient air 1186 by convection. In alternative embodiments, the microfluidic channel draws heat to a heat reservoir (not shown) or draws heat towards other components of the device 1100 that may require higher operating temperatures.

The microfluidic channel 1160 can be patterned into the encapsulating layers 1109 and 1111 using any of the patterning methods described above, such as those described in connection with via formation for cross-layer interconnects. In certain other fabrication techniques, the microfluidic channel 1160 is first patterned using any of the patterning methods described above, and then filled with a sacrificial material. This is beneficial when a subsequent layer of components is to be disposed above the layer 1110, since, as mentioned above, in certain techniques the encapsulating material for the subsequent layer is flowed over the layer 1110 and would otherwise flow into the microfluidic channel 1160. After forming the subsequent layer, the manufacturer can chemically dissolve the sacrificial material from the microfluidic channel 1160.

In certain embodiments, ambient air flows through the microfluidic channel 1160 to serve as the convection medium. In others, a manufacturer fills the microfluidic channel 1160 with a liquid, such as sodium and/or potassium. The manufacturer may fill the microfluidic channels with a cryogenic coolant such as liquid helium or liquid nitrogen, although these materials can be included in vapor phase as well. Other exemplary materials for use within the microfluidic channel 1160 include ammonia, water, acetone, and/or methanol.

In still other embodiments, the manufacturer deposits a nanocomposite material within the microfluidic channel 1160. The nanocomposite material can be a liquid, or can be a solid that is flowed into the microfluidic channel 1160 as a liquid and subsequently cured. In certain embodiments, nanoparticles are incorporated into a base material and deposited within the microfluidic channel 1160 to increase the thermal conductivity of the base material. Exemplary nanoparticle materials include metallic nanoparticles, carbon nanotubes, and/or ceramic nanoparticles.

In various embodiments, the microfluidic channel 1160 takes on various shapes and configurations. The depicted microfluidic channel 1160 includes a plurality of extensions 1161 that interface with the metallization layer 184. Several extensions 1161 are beneficial at least in part to provide more surface area for thermal interfacing with the component 1117.

As mentioned above, in addition to transferring heat, microfluidic channels can transfer fluids for environmental sampling. By way of example, the depicted component 1119 is a biochemical sensor, and microfluidic channels 1188 and 1190 transport fluids to the component 1119 for sampling, analysis, and processing. The manufacturer forms microfluidic channels 1188 and 1190 using any of the patterning techniques described herein.

In one exemplary use, a fluid sample is provided to the component 1119 via channels 1188 and 1190. The component 1119 is a sensor that detects the presence of one or more preselected chemical compositions within the fluid sample. The component 1119 may include wireless communication capabilities to transmit the detection results to a remote location, or may couple to an optical waveguide (to be discussed in more detail below) to optically communicate the detection results to another subsystem component or to a remote location external to device 1100. In addition to fluid sample acquisition, microfluidic channels and related structures can be used for fluid flow control, extraction, filtration and loading.

Microfluidic channels for transporting samples can also take on other shapes, sizes, and configurations. For example, microfluidic channels configured like microfluidic channel 1160 can be used to transport fluid samples. In still other embodiments, microfluidic channels transport samples among components, such as from one of the components 1112-1119 to one or more of the components 1112-1119.

Figure 16:
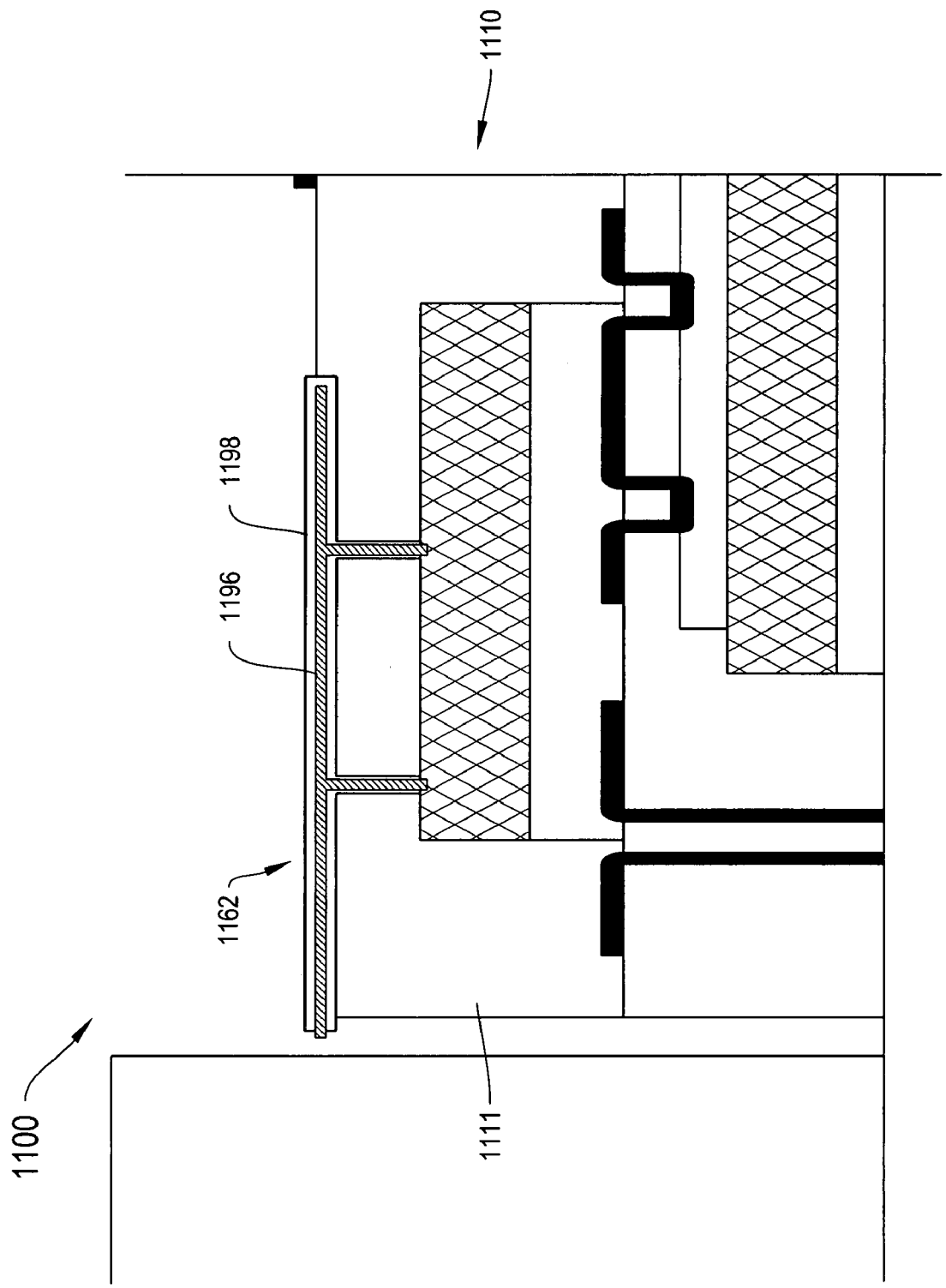
FIG. 16 shows a close-up view of a third portion of the device 1100 of FIG. 12 and shows an element for routing optical signals, according to an illustrative embodiment of the invention.

FIG. 16 shows a close-up view of a third portion of the device 1100 of FIG. 12 and shows an element for routing optical signals, according to an illustrative embodiment of the invention. More particularly, the device 1100 includes an optical waveguide 1162. The optical waveguide transmits optical communication signals to other components within the device 1100, or to another component external to the device 1100. The optical waveguide includes a core 1196 through which the optical signals transmit, and a cladding 1198 for reflecting the optical signals and allowing total internal reflection within the optical waveguide 1162. In the depicted embodiment, the core 1196 comprises the same material as the encapsulating layer 1111, which as mentioned above is transparent to light at wavelengths suitable for optical communication. In certain embodiments, the cladding 1198 is formed by selectively removing portions of the encapsulating layer 1111 that surround the region of the encapsulating layer 1111 that is to be the core 1196. The cladding 1198 may simply be the selectively removed portions; ambient air that flows into the selectively removed portion may have a sufficiently low refractive index so as to allow for total internal reflection. In other embodiments, the selectively removed portions are filled with a material, such as a polymer (e.g., benzocyclobutene). Thus, the optical waveguide 162 may include a polymer core surrounded by a polymer cladding.

In addition to optical waveguides, the device 1100 may include other structures for routing optical signals. By way of example, a manufacturer can fabricate and orient mirrors within the device 1100 at selected angles (e.g., 45 degree angles or 90 degree angles) to reflect optical signals in accordance with a desired signal path. In one exemplary technique, the manufacturer patterns walls, using any of the patterning techniques described herein, and coats the walls with a reflective material such as gold. Additionally, or alternatively, the manufacturer may deposit anti-reflective walls or films to avoid signal loss or cross-talk among signals. For example, the manufacturer may deposit films of titanium dioxide or silicon dioxide with thicknesses of about one quarter-wavelength.

In addition to fabricating walls or films for routing and processing optical signals, the manufacturer may also incorporate nanoparticles or nanoporous structures within the device. For example, the manufacturer can form optical filters by incorporating nanoparticles or nanoporous structures in certain regions of the encapsulating layers 1111, 1109, 1107, and 1105 of the device 1100 to selectively absorb certain wavelengths of light. Exemplary materials for the nanoparticles include colloidal dyes, such as metal selenides, which can have high extinction coefficients to produce sharp absorption transitions. The manufacturer can also introduce pigments and/or color centers to control the optical properties by allowing the encapsulating layers to either absorb, transmit, reflect, scatter and/or diffract light in a predetermined fashion. Exemplary methods by which the manufacturer can introduce nanopores into the encapsulating layer include ultraviolet crosslinking, co-polymerization of multiple species, or by use of porogens. The manufacturer can also fabricate pores in the integrated circuit material using methods such as chemical etching, electrochemical etching, or plasma etching. The pore volume in the materials can be tuned to achieve different thermal, electrical, optical, and catalytic characteristics in parts of or all of the subsystem.

The above-described methods can also be used to fabricate other optical components, such as optical absorbers, optical reflectors, optical scatterers, optical splitters, and/or optical diffracters. The manufacturer may also fabricate structures to support the above-described components. For example, in certain embodiments, the manufacturer fabricates grooves or clips for positioning optical fibers that couple with one or more of the components 1112-1119.

Figure 17:
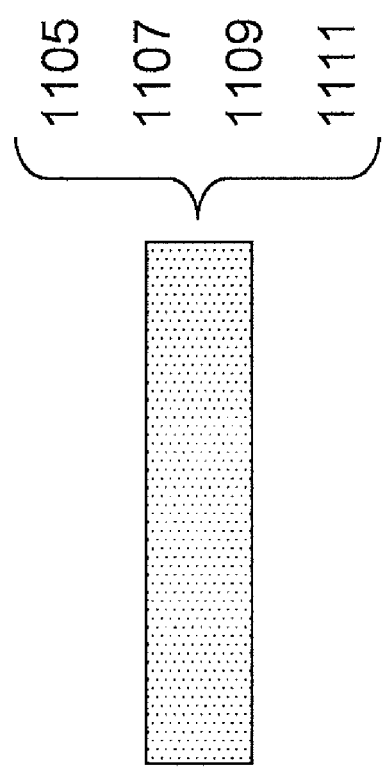
FIG. 17 shows an encapsulating layer incorporating nanoparticles, nanoporous structures, or small-scale molecular species, according to various embodiments of the invention.

As mentioned above, and as depicted in FIG. 17, the manufacturer may incorporate nanoparticles, nanoporous structures, or small-scale molecular species into the encapsulating layers 1105, 1107, 1109, and 1111. The incorporation of nanoparticles, nanoporous structures, and molecular species allows a manufacturer to tune the magnetic, electrical, thermal, mechanical and optical properties of the encapsulating layers 1105, 1107, 1109, and 1111. These materials may be introduced and dispersed into the encapsulating layers prior to the solidifying and crosslinking steps described above. Alternatively, the nanoparticles may be nucleated and precipitated within the encapsulating layer 1105, 1107, 1109, and 1111 materials prior to solidification using common precursor chemistries, such as tetraethylorthosilicate.

By way of example, the nanoparticles may be ferromagnetic nanoparticles that alter the magnetic properties of the encapsulating layers 1105, 1107, 1109, and 1111. As mentioned above, the components 1112-1119 may include passive components such as an inductor. In certain embodiments, the manufacturer incorporates nanoparticles that increase the permeability of the device proximal to the inductor and thereby increases the inductance of the inductor. This allows high value inductors, such as inductors with inductances of greater than about 10 nH, to be integrated within the device 1100. Similarly, the components 1112-1119 may include a capacitor, and the manufacturer can incorporate nanoparticles that increase the permittivity proximal to the capacitor and thereby increase the capacitance of the capacitor.

The manufacturer can also include nanoparticles to alter the thermal conductivity of portions of the encapsulating layers 1105, 1107, 1109, and 1111. In certain embodiments, the manufacturer incorporates nanoparticles at preselected locations to increase the thermal conductivity of certain regions of the device 1100 to serve as heat dissipation pathways. Exemplary nanoparticles for this purpose include copper, aluminum, aluminum nitride, and/or silicon. These heat dissipation pathways can be used in addition to or as an alternative to the microfluidic heat dissipation channels mentioned above. In addition to heat dissipation pathways, the manufacturer can dispose thermally insulative nanoparticles in regions of the device 1100 to form heat shields around one or more components 1112-1119 to thermally insulate the one or more components 1112-119 from the rest of the device 1100.

Additionally or alternatively, the manufacturer can include nanoparticles to alter the mechanical properties of the device, such as the device's elasticity, strength, or thermal expansion properties. Exemplary materials for this purpose include silicon dioxide, carbon nanotubes, titanium dioxide, and/or aluminum oxide based nanoparticles.

Other properties that can be altered by incorporating nanoparticles include electrical conductivity, dielectric constant, dielectric loss tangent, absorption coefficient, glass temperature, refractive index, viscosity, and/or Poisson's ratio.

The above description is not intended to be limiting, and variations on the multi-component device 1000 described above are possible. The multi-component devices consistent with this invention can have functionalities related to any digital, analog, radio frequency, microwave, energy/power source, antenna, micro-electro-mechanical system (MEMS), microfluidic, waveguide optical, and actuator components. Exemplary applications of such multi-component devices include wireless phones, personal digital assistants, laptops, biotechnology applications such as implantable devices including, but not limited to, defibrillators, pace makers, and glucose monitoring systems, at home diagnostics kits for pathological conditions such as, but not limited to, diabetes, viruses, cardiac disease/failure, and/or clinical diagnostics for high throughput drug screening and/or drug discovery.

The invention may be embodied in other specific forms without departing form the spirit or essential characteristics thereof. The foregoing embodiments are therefore to be considered in all respects illustrative, rather than limiting of the invention.

What is claimed is:

1. A method of forming a device, comprising:
   forming a first device, wherein forming the first device comprises:
   providing a first substrate,
   etching recesses in the first substrate,
   after etching the recesses in the first substrate, coupling a first set of components to the first substrate,
   encapsulating the first set of components with a first encapsulating layer,
   planarizing the first substrate until interconnects are exposed,
   forming at least a second device, wherein forming the at least a second device comprises:
   providing a second substrate,
   coupling a second set of components to the second substrate,
   encapsulating the second set of components with a second encapsulating layer, and
   functionally interconnecting at least one component of the first set of components of the first device with at least one component of the second set of components of the second device, via at least one of the exposed interconnects.

2. The method of claim 1, wherein at least one of coupling the first set of components and coupling the second set of components comprises coupling an integrated circuit die.

3. The method of claim 1, wherein at least one of coupling the first set of components and coupling the second set of components comprises coupling components for wireless communication.

4. The method of claim 1, wherein at least one of coupling the first set of components and coupling the second set of components comprises coupling optical signal processors.

5. The method of claim 1, wherein at least one of coupling the first set of components and coupling the second set of components comprises coupling a sensor.

6. The method of claim 1, wherein at least one of coupling the first set of components and coupling the second set of components comprises coupling a transducer.

7. The method of claim 1, wherein at least one of coupling the first set of components and coupling the second set of components comprises coupling a passive component.

8. The method of claim 1, further comprising fabricating a passive component within at least one of the first encapsulating layer and the second encapsulating layer.

9. The method of claim 1, further comprising routing optical signals within the device.

10. The method of claim 1, further comprising forming an optical waveguide within the device.

11. The method of claim 1, further comprising incorporating nanoparticles within at least one of the first encapsulating layer and the second encapsulating layer to alter properties of a portion of the device.

12. The method of claim 1, further comprising incorporating nanoporous structures within at least one of the first encapsulating layer and the second encapsulating layer to alter properties of a portion of the device.

13. The method of claim 12, wherein incorporating nanoporous structures comprises incorporating nanoporous structures to alter at least one of the electrical conductivity, the thermal conductivity, and the mechanical properties of the portion of the device.

14. The method of claim 1, wherein at least one of disposing the first encapsulating layer and disposing the second encapsulating layer comprises disposing a dielectric polymer material.

15. The method of claim 1, wherein at least one of disposing the first encapsulating layer and disposing the second encapsulating layer comprises disposing a thermoplastic material.

16. The method of claim 1, wherein at least one of disposing the first encapsulating layer and disposing the second encapsulating layer comprises disposing a thermoset material.

17. The method of claim 1, wherein at least one of disposing the first encapsulating layer and disposing the second encapsulating layer comprises disposing at least one of polymethyl methacrylate, polyimide, and benzocyclobutenes.

18. The method of claim 1, further comprising removing at least a portion of at least one of the first encapsulating layer and the second encapsulating layer.

19. The method of claim 1, wherein at least one of disposing the first encapsulating layer and disposing the second encapsulating layer comprises disposing SU-8.

20. The method of claim 1, wherein at least one of disposing the first encapsulating layer and disposing the second encapsulating layer comprises disposing a material in a liquid phase.

21. The method of claim 1, wherein at least one of disposing the first encapsulating layer and disposing the second encapsulating layer comprises disposing a material in a vapor phase.

22. The method of claim 1, further comprising:
   depositing a metallic interconnection layer on the first encapsulating layer, and
   coupling the second set of components directly on the metallic interconnection layer.

23. The method of claim 1, further comprising:
depositing a metallic interconnection layer on the first encapsulation layer,
depositing a dielectric layer over the metallic interconnection layer, and
coupling the second set of components directly on the dielectric layer.

24. The method of claim 1, wherein functionally interconnecting at least one of the first set of components with at least one of the second set of components comprises electrically interconnecting at least one of the first set of components with at least one of the second set of components.

25. The method of claim 1, further comprising disposing a microfluidic channel within at least one of the first encapsulating layer and the second encapsulating layer.

26. The method of claim 1, wherein etching the recesses leaves posts extending from the bottom of the recesses, the method further comprising metallizing the posts to form electrical interconnects between the first set of components and the second set of components.

27. The method of claim 3, wherein coupling components for wireless communication comprises coupling at least one of amplifiers, monolithic microwave integrated circuits, synthesizers, and vocoders.

28. The method of claim 3, wherein coupling components for wireless communication comprises coupling at least one of gallium arsenide components and silicon components.

29. The method of claim 5, further comprising detecting, by the sensor, the presence of a preselected chemical composition in the fluid sample.

30. The method of claim 6, wherein coupling the transducer comprises coupling at least one of a mechanical actuator, a thermal actuator, an optical actuator, an electrical actuator, a chemical actuator, and a fluidic actuator.

31. The method of claim 30, wherein coupling the transducer comprises coupling at least one of a motor, a piston, a relay, a microphone, a piezoelectric device, a battery, and a fuel cell.

32. The method of claim 7, wherein coupling passive components comprises coupling at least one of a resistor, an inductor, and a capacitor.

33. The method of claim 11, wherein incorporating nanoparticles comprises incorporating nanoparticles to alter at least one of the electrical conductivity, the thermal conductivity, and the mechanical properties of the portion of the device.

34. The method of claim 24, wherein electrically interconnecting at least one of the first set of components with at least one of the second set of components comprises:
disposing a via within the first encapsulating layer from an upper surface of the first encapsulating layer to an upper surface of the at least one of the first set of components, and
metallizing the via.

35. The method of claim 25 further comprising:
allowing the microfluidic channel to be filled with a thermally conductive material, and
drawing, by the thermally conductive material, heat away from at least one component of the first set of components and the second set of components.

36. The method of claim 25, further comprising coupling the microfluidic channel in fluid communication with a sensor and an external fluid sample, and allowing the fluid sample to flow through the microfluidic channel to the sensor.

37. The method of claim 26, wherein the interconnects exposed by removing the substrate comprise the metallization deposited on the posts, and removing the substrate leaves at least a portion of the posts intact.

38. The method of claim 37, wherein functionally interconnecting at least one component of the first set of components of the first device with at least one component of the second set of components of the second device comprises electrically coupling the at least one component of the first set of components to one end of an intact post portion and electrically coupling the at least one component of the second set of components to an opposing end of the intact post portion.

39. A method of forming a device, comprising:
forming a first device, wherein forming the first device comprises:
providing a first substrate,
coupling a first set of components to the first substrate,
prior to coupling the first set of components to the first substrate, etching die plinths in the first substrate such that the first set of components, after the coupling, will have a common height,
encapsulating the first set of components with a first encapsulating layer,
planarizing the first substrate until interconnects are exposed,
forming at least a second device, wherein forming the at least a second device comprises:
providing a second substrate,
coupling a second set of components to the second substrate,
encapsulating the second set of components with a second encapsulating layer, and
functionally interconnecting at least one component of the first set of components of the first device with at least one component of the second set of components of the second device, via at least one of the exposed interconnects.

* * * * *